US009790087B2

(12) United States Patent
Fukuzawa et al.

(10) Patent No.: US 9,790,087 B2
(45) Date of Patent: *Oct. 17, 2017

(54) STRAIN AND PRESSURE SENSING DEVICE, MICROPHONE, METHOD FOR MANUFACTURING STRAIN AND PRESSURE SENSING DEVICE, AND METHOD FOR MANUFACTURING MICROPHONE

(71) Applicant: Kabushiki Kaisha Toshiba, Minato-ku (JP)

(72) Inventors: Hideaki Fukuzawa, Kanagawa-ken (JP); Tatsuya Ohguro, Kanagawa-ken (JP); Akihiro Kojima, Kanagawa-ken (JP); Yoshiaki Sugizaki, Kanagawa-ken (JP); Mariko Takayanagi, Kanagawa-ken (JP); Yoshihiko Fuji, Kanagawa-ken (JP); Akio Hori, Kanagawa-ken (JP); Michiko Hara, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 117 days.

This patent is subject to a terminal disclaimer.

(21) Appl. No.: 14/582,295

(22) Filed: Dec. 24, 2014

(65) Prior Publication Data
US 2015/0118779 A1 Apr. 30, 2015

Related U.S. Application Data

(62) Division of application No. 13/536,002, filed on Jun. 28, 2012, now Pat. No. 8,958,574.

(30) Foreign Application Priority Data

Sep. 27, 2011 (JP) .................................. 2011-211212

(51) Int. Cl.
*H04R 3/00* (2006.01)
*B81C 1/00* (2006.01)
(Continued)

(52) U.S. Cl.
CPC ...... *B81C 1/00158* (2013.01); *B81C 1/00246* (2013.01); *G01L 9/0042* (2013.01);
(Continued)

(58) Field of Classification Search
CPC .................. H04R 19/005; H04R 19/04; H04R 2201/003; H04R 17/00; H04R 2499/11;
(Continued)

(56) References Cited

U.S. PATENT DOCUMENTS 7,952,349 B2 * 5/2011 Huang ................. A61N 1/3787
324/109
2004/0050172 A1 3/2004 Quandt et al.
(Continued)

FOREIGN PATENT DOCUMENTS

CN 101131335 A 2/2008
JP 9-18020 1/1997
(Continued)

OTHER PUBLICATIONS

Office Action issued Oct. 9, 2015 in Japanese Patent Application No. 2014-256637 (with English language translation).
(Continued)

*Primary Examiner* — Alexander Jamal
(74) *Attorney, Agent, or Firm* — Oblon, McClelland, Maier & Neustadt, L.L.P.

(57) ABSTRACT

According to one embodiment, a strain and pressure sensing device includes a semiconductor circuit unit and a sensing unit. The semiconductor circuit unit includes a semiconductor substrate and a transistor. The transistor is provided on a semiconductor substrate. The sensing unit is provided on the semiconductor circuit unit, and has space and non-space portions. The non-space portion is juxtaposed with the space portion. The sensing unit further includes a movable beam, a strain sensing element unit, and first and second buried
(Continued)

interconnects. The movable beam has fixed and movable portions, and includes first and second interconnect layers. The fixed portion is fixed to the non-space portion. The movable portion is separated from the transistor and extends from the fixed portion into the space portion. The strain sensing element unit is fixed to the movable portion. The first and second buried interconnects are provided in the non-space portion.

16 Claims, 21 Drawing Sheets

(51) Int. Cl.
    *G01L 9/00* (2006.01)
    *H04R 1/08* (2006.01)
    *H04R 19/00* (2006.01)
    *H04R 19/04* (2006.01)
    *H04R 31/00* (2006.01)

(52) U.S. Cl.
    CPC ............ *H04R 1/08* (2013.01); *H04R 19/005* (2013.01); *H04R 19/04* (2013.01); *H04R 31/00* (2013.01); *B81B 2201/0264* (2013.01); *B81C 2203/0771* (2013.01)

(58) Field of Classification Search
    CPC ............ H04R 31/00; B81B 2201/0257; B81B 2201/0264
    USPC ......................... 381/114, 115, 173, 174, 190
    See application file for complete search history.

(56) References Cited

U.S. PATENT DOCUMENTS

| | | | | |
|---|---|---|---|---|
| 2005/0089180 A1* | 4/2005 | Saeki | ................... | H04R 19/016 381/174 |
| 2005/0193822 A1* | 9/2005 | Amano | ..................... | G01L 1/16 73/704 |
| 2005/0210988 A1 | 9/2005 | Amano et al. | | |
| 2006/0246271 A1 | 11/2006 | Quandt et al. | | |
| 2007/0151356 A1 | 7/2007 | Sumigawa et al. | | |
| 2007/0158826 A1 | 7/2007 | Sakakibara et al. | | |
| 2008/0019545 A1* | 1/2008 | Jhung | ..................... | H04R 17/00 381/190 |
| 2008/0055163 A1 | 3/2008 | Man et al. | | |
| 2008/0072684 A1 | 3/2008 | Baniecki et al. | | |
| 2008/0094059 A1 | 4/2008 | Sasaki et al. | | |
| 2008/0130935 A1 | 6/2008 | Sato et al. | | |
| 2009/0245544 A1* | 10/2009 | Horng | ..................... | H04R 9/048 381/176 |
| 2011/0295128 A1 | 12/2011 | Yuasa et al. | | |
| 2012/0079887 A1 | 4/2012 | Giddings et al. | | |
| 2012/0245477 A1 | 9/2012 | Giddings et al. | | |
| 2013/0255393 A1 | 10/2013 | Fukuzawa et al. | | |
| 2014/0090486 A1 | 4/2014 | Fuji et al. | | |
| 2014/0137658 A1 | 5/2014 | Higashi et al. | | |
| 2014/0137668 A1 | 5/2014 | Fukuzawa et al. | | |
| 2014/0369530 A1 | 12/2014 | Fuji et al. | | |

FOREIGN PATENT DOCUMENTS

| | | |
|---|---|---|
| JP | 2003-37312 A | 2/2003 |
| JP | 2006-3182 A | 1/2006 |
| JP | 2007-180201 | 7/2007 |
| JP | 2008-82773 A | 4/2008 |
| JP | 2008-107323 A | 5/2008 |
| JP | 2009-5077 | 1/2009 |
| JP | 2011-244938 | 12/2011 |

OTHER PUBLICATIONS

Office Action mailed Sep. 28, 2014 in Chinese Application No. 201210225044.5 (w/English translation).
Office Action issued Oct. 31, 2014 in Japanese Patent Application No. 2011-211212 (w/English translation).

* cited by examiner

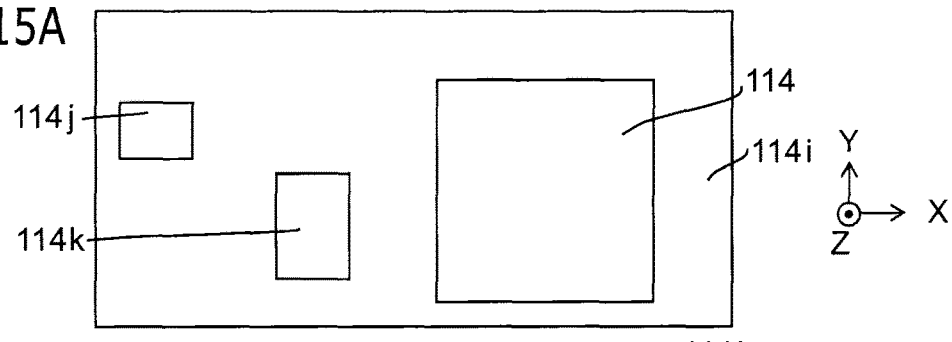
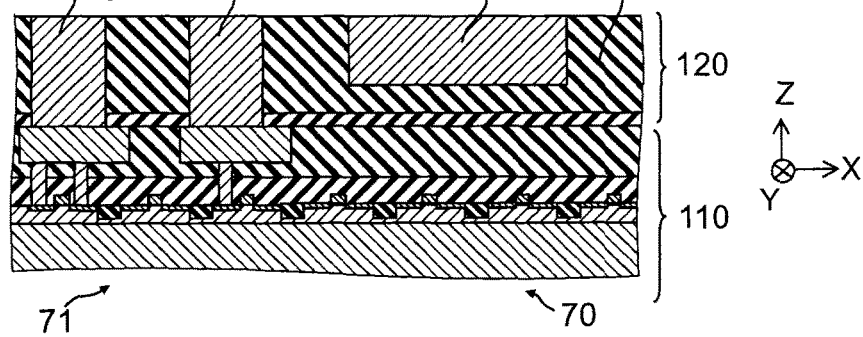
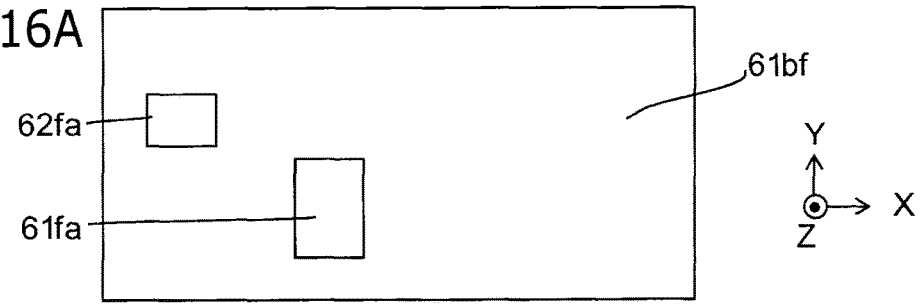
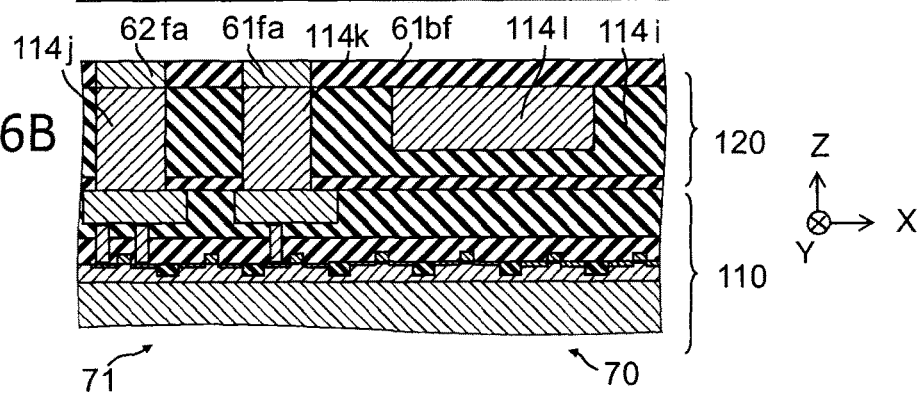

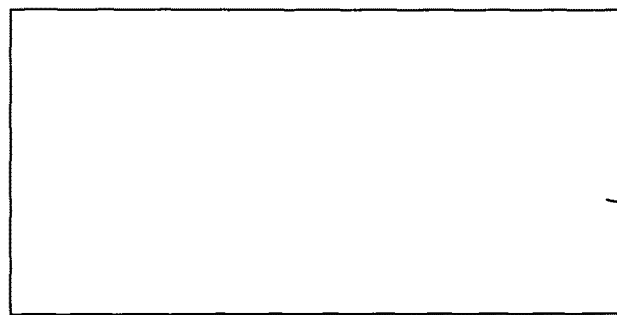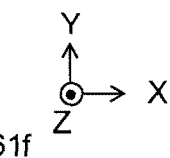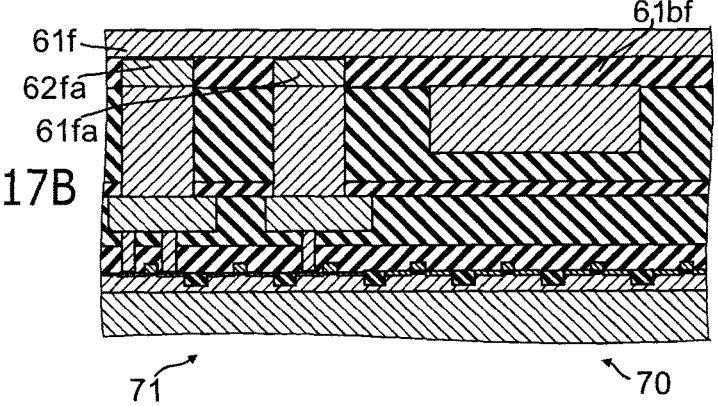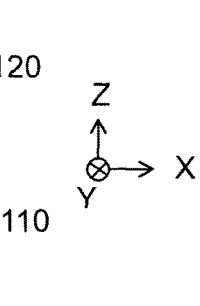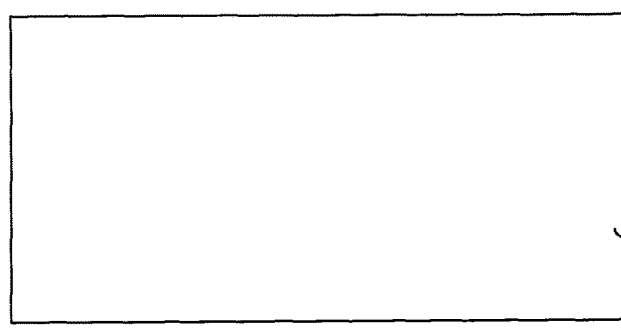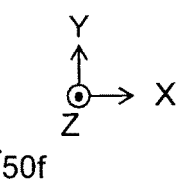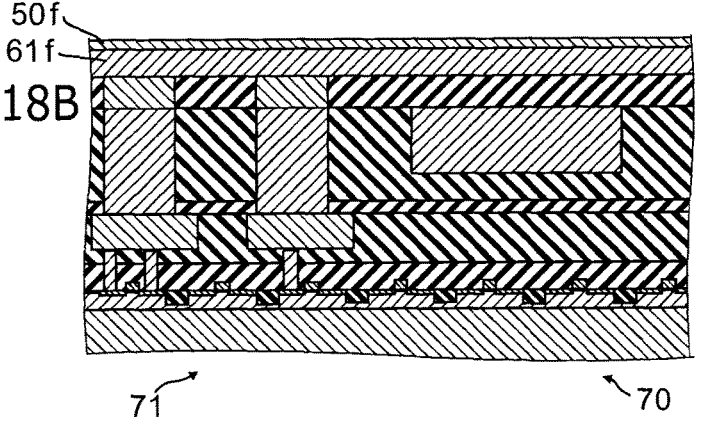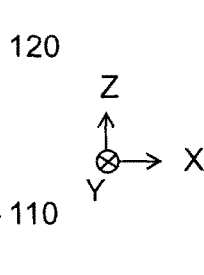

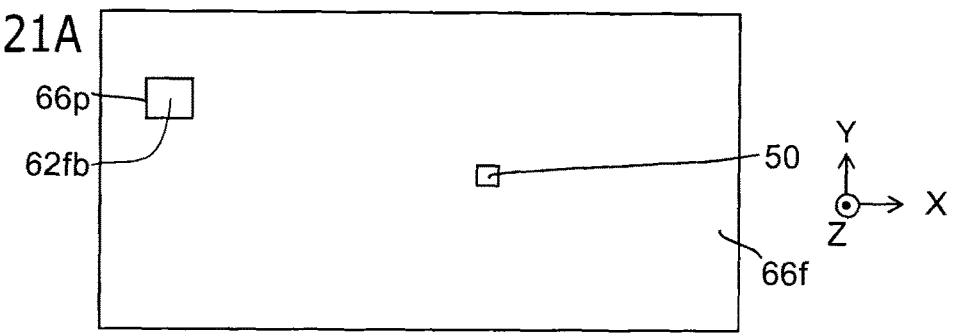
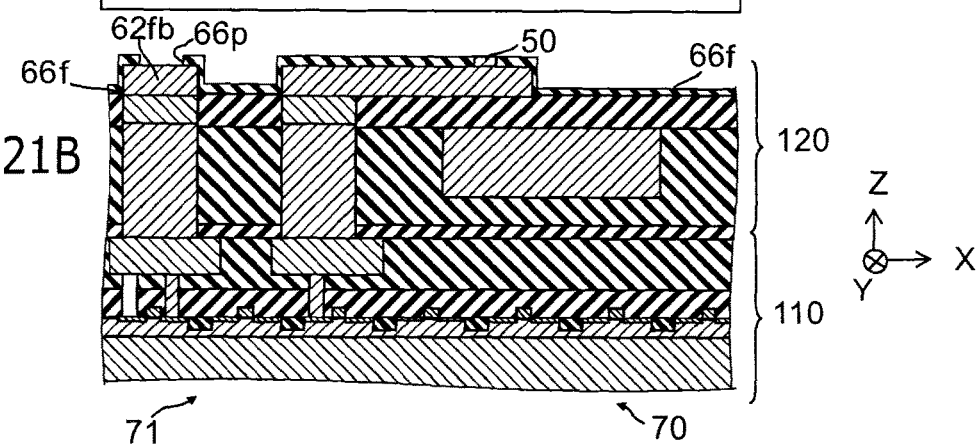
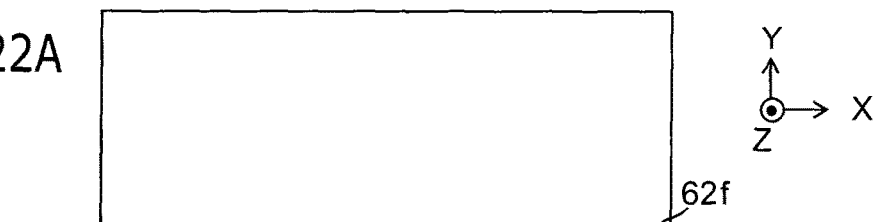
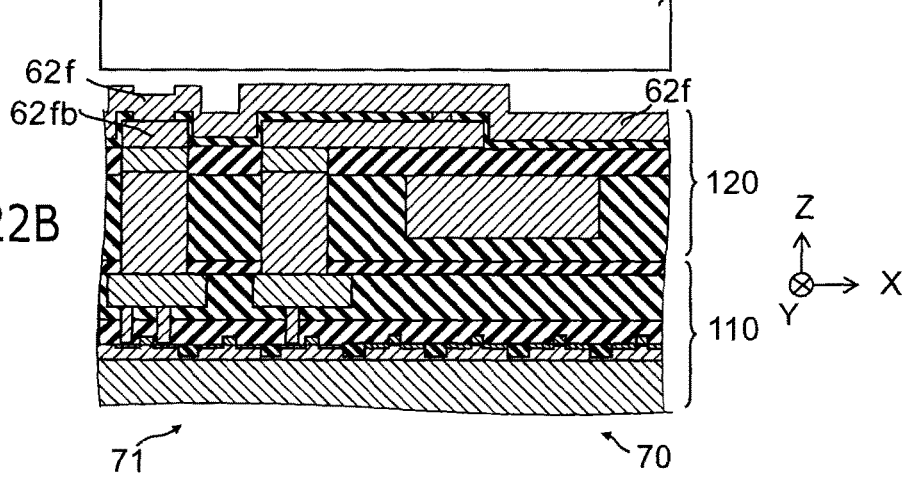

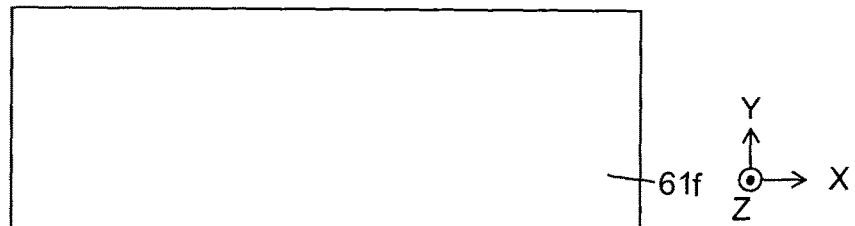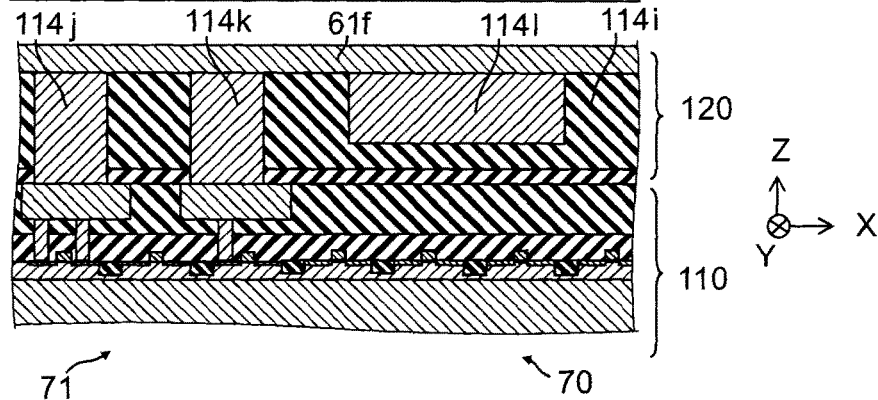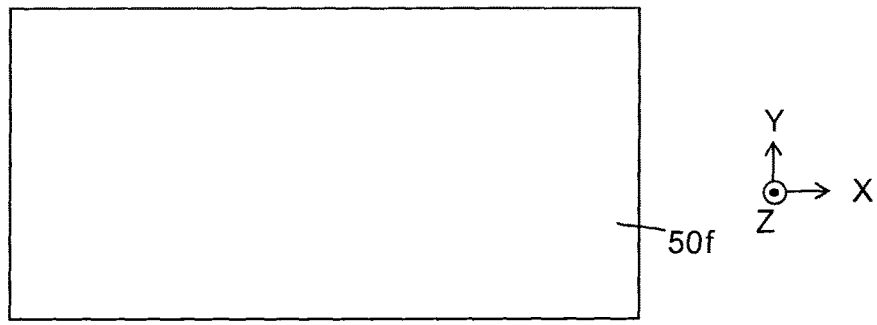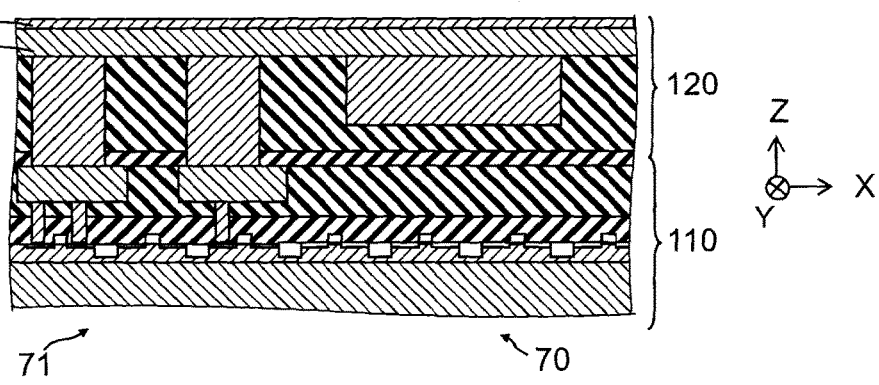

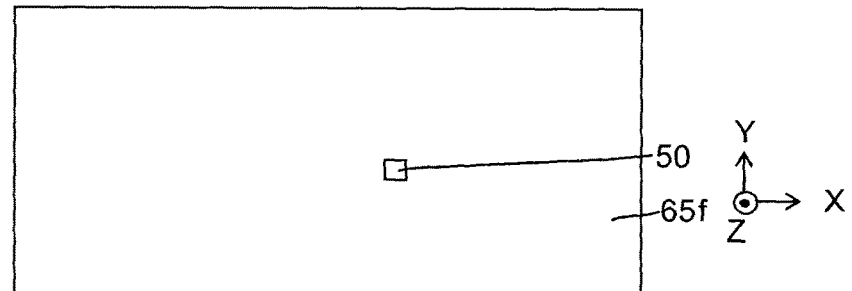
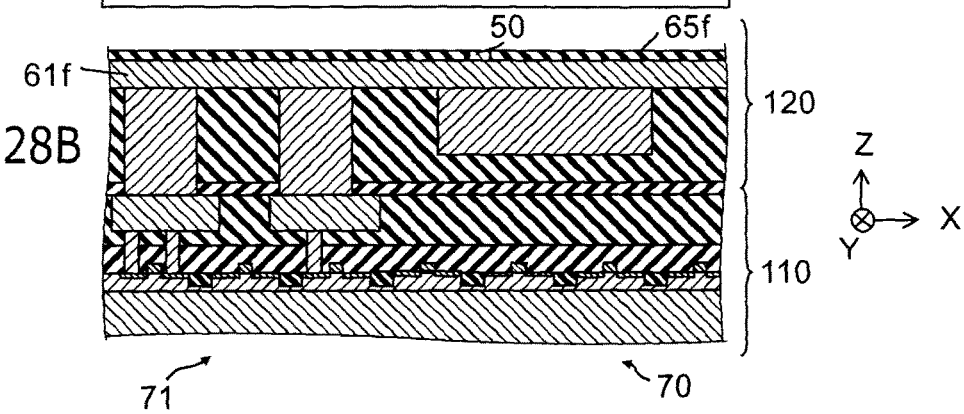
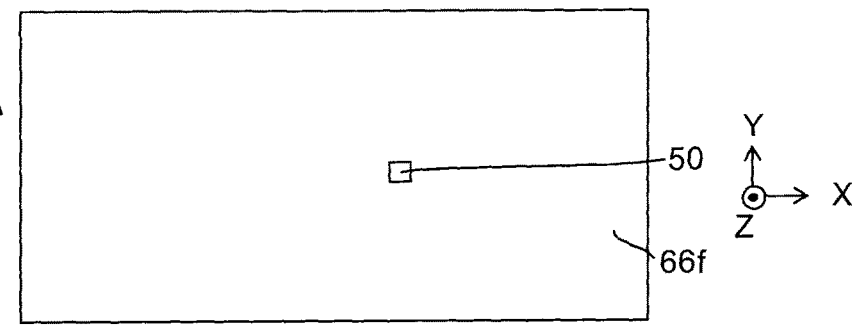
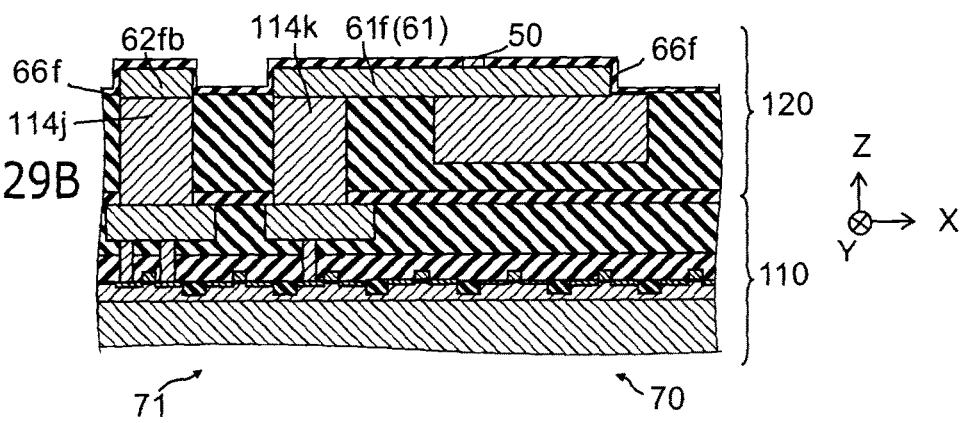

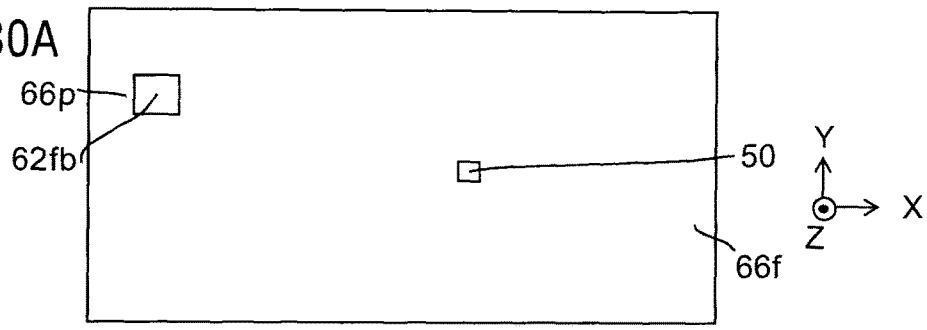
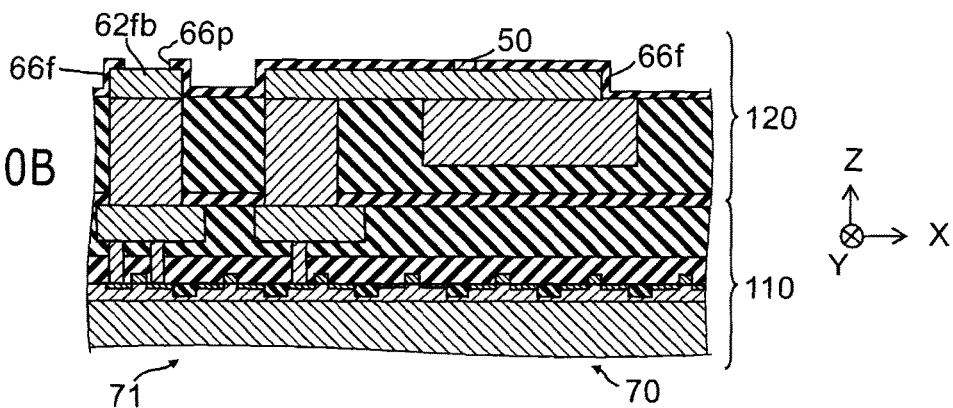
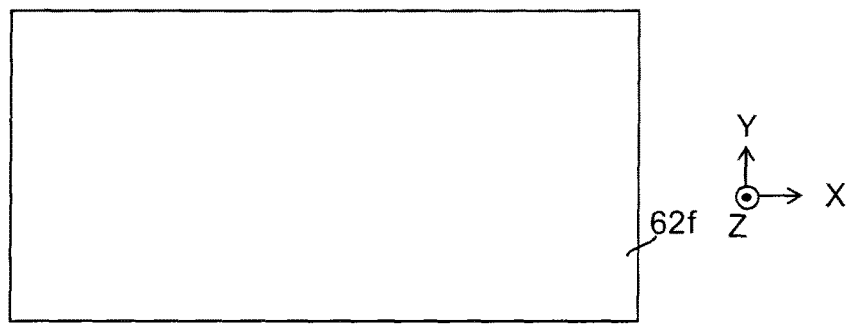
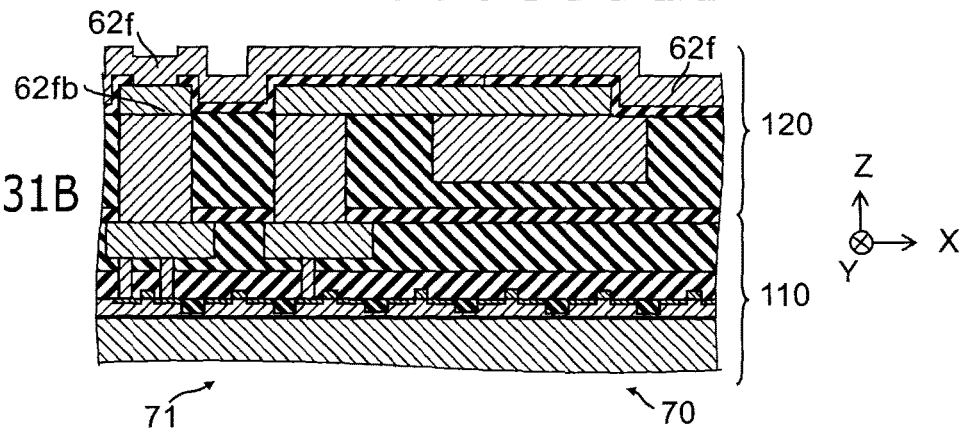

STRAIN AND PRESSURE SENSING DEVICE, MICROPHONE, METHOD FOR MANUFACTURING STRAIN AND PRESSURE SENSING DEVICE, AND METHOD FOR MANUFACTURING MICROPHONE

CROSS-REFERENCE TO RELATED APPLICATIONS

This application is a division of and claims the benefit of priority under 35 U.S.C. §120 from U.S. Ser. No. 13/536,002 filed Jun. 28, 2012, and claims the benefit of priority under 35 U.S.C. §119 from Japanese Patent Application No. 2011-211212 filed Sep. 27, 2011; the entire contents of each of which are incorporated herein by reference.

FIELD

Embodiments described herein relate generally to a strain and pressure sensing device, a microphone, a method for manufacturing a strain and pressure sensing device, and a method for manufacturing a microphone.

BACKGROUND

A strain sensor that can measure strain with high sensitivity even for a micro region is necessary. For example, there is a configuration in which a semiconductor sensor chip including an acoustic detection unit that detects pressure fluctuations from vibrations is electrically connected to a control circuit chip by bonding wires. However, in such a configuration, downsizing of the device is difficult; and it is difficult to measure the strain with high sensitivity for a micro region.

BRIEF DESCRIPTION OF THE DRAWINGS

FIG. 13A, FIG. 13B, FIG. 14A, FIG. 14B, FIG. 15A, FIG. 15B, FIG. 16A, FIG. 16B, FIG. 17A, FIG. 17B, FIG. 18A, FIG. 18B, FIG. 19A, FIG. 19B, FIG. 20A, FIG. 20B, FIG. 21A, FIG. 21B, FIG. 22A, FIG. 22B, FIG. 23A, FIG. 23B, FIG. 24A, and FIG. 24B are schematic views showing a method for manufacturing the strain and pressure sensing device according to the first embodiment;

FIG. 26A, FIG. 26B, FIG. 27A, FIG. 27B, FIG. 28A, FIG. 28B, FIG. 29A, FIG. 29B, FIG. 30A, FIG. 30B, FIG. 31A, FIG. 31B, FIG. 32A, FIG. 32B, FIG. 33A, and FIG. 33B are schematic views showing the method for manufacturing the strain and pressure sensing device according to the first embodiment;

DETAILED DESCRIPTION

Figure 1:
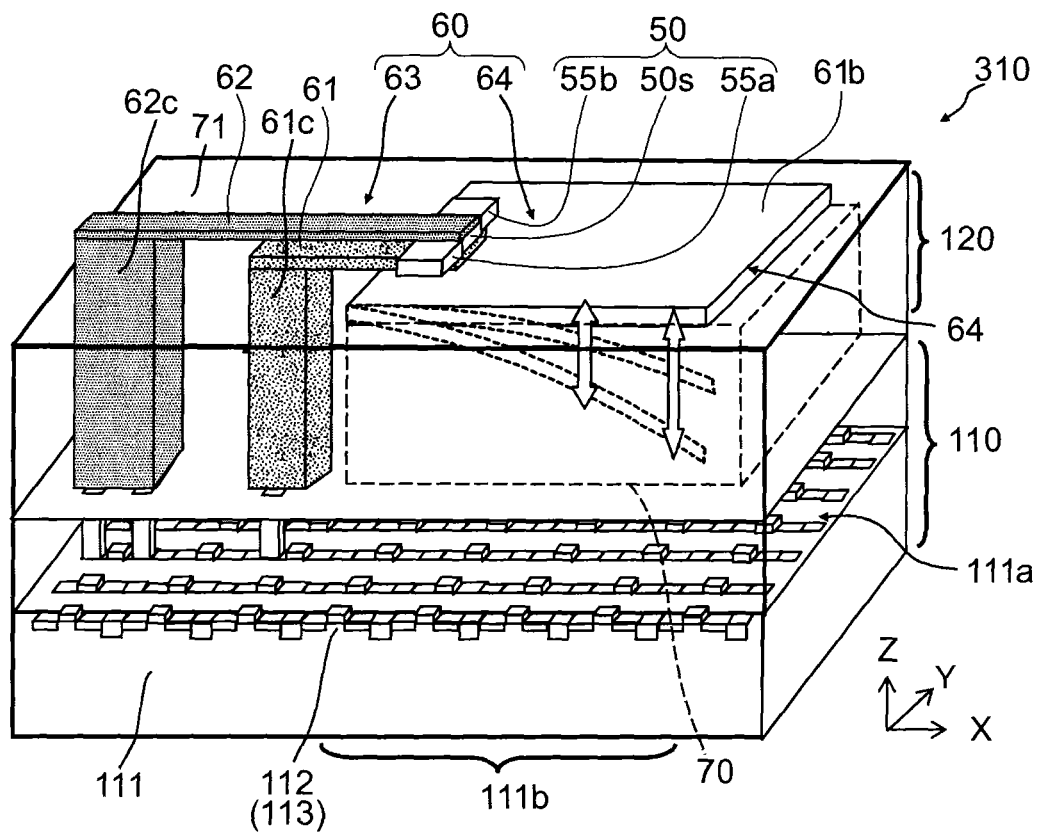
FIG. 1 is a schematic perspective view showing a strain and pressure sensing device according to a first embodiment.

According to one embodiment, a strain and pressure sensing device includes a semiconductor circuit unit and a sensing unit. The semiconductor circuit unit includes a semiconductor substrate and a transistor provided on the semiconductor substrate. The sensing unit is provided on the semiconductor circuit unit. The sensing unit has a space portion and a non-space portion. The space portion is provided above the transistor. The non-space portion is juxtaposed with the space portion in a plane parallel to a surface of the semiconductor with the transistor provided. The sensing unit further includes a movable beam, a strain sensing element unit, a first buried interconnect, and a second buried interconnect. The movable beam has a fixed portion and a movable portion. The movable beam includes a first interconnect layer and a second interconnect layer. The fixed portion is fixed to the non-space portion. The movable portion is separated from the transistor and extends from the fixed portion into the space portion. A distance between the transistor and the movable portion is changeable. The first interconnect layer and the second interconnect layer extend from the fixed portion toward the movable portion. The strain sensing element unit is fixed to the movable portion. One end of the strain sensing element unit is electrically connected to the first interconnect layer. One other end of the strain sensing element unit is electrically connected to the second interconnect layer. The strain sensing element unit includes a first magnetic layer. The first buried interconnect is provided in the non-space portion to electrically connect the first interconnect layer with the semiconductor circuit unit. The second buried interconnect is provided in the non-space portion to electrically connect the second interconnect layer with the semiconductor circuit unit.

According to one embodiment, a microphone includes a semiconductor circuit unit and a sensing unit. The semiconductor circuit unit includes a semiconductor substrate and a transistor provided on the semiconductor substrate. The sensing unit is provided on the semiconductor circuit unit. The sensing unit has a space portion and a non-space portion. The space portion is provided above the transistor. The non-space portion is juxtaposed with the space portion in a plane parallel to a surface of the semiconductor with the transistor provided. The sensing unit further includes a movable beam, a strain sensing element unit, a first buried interconnect, and a second buried interconnect. The movable beam has a fixed portion and a movable portion. The movable beam includes a first interconnect layer and a second interconnect layer. The fixed portion is fixed to the non-space portion. The movable portion is separated from the transistor and extends from the fixed portion into the space portion. A distance between the transistor and the movable portion is changeable. The first interconnect layer and the second interconnect layer extend from the fixed portion toward the movable portion. The strain sensing element unit is fixed to the movable portion. One end of the strain sensing element unit is electrically connected to the first interconnect layer. One other end of the strain sensing element unit is electrically connected to the second interconnect layer. The strain sensing element unit includes a first magnetic layer. The first buried interconnect is provided in the non-space portion to electrically connect the first interconnect layer with the semiconductor circuit unit. The second buried interconnect is provided in the non-space portion to electrically connect the second interconnect layer with the semiconductor circuit unit.

According to one embodiment, a method is disclosed for manufacturing a strain and pressure sensing device. The method can include forming a transistor on a semiconductor substrate. The method can include forming an inter-layer insulating layer on the semiconductor substrate and forming a sacrificial layer on the transistor. The method can include forming a first conductive layer used to form a first interconnect layer on the inter-layer insulating layer and the sacrificial layer. The method can include forming a strain sensing element unit including a first magnetic layer on the first conductive layer on the sacrificial layer. The method can include forming a second conductive layer used to form a second interconnect layer on the strain sensing element unit. The method can include forming a first buried interconnect and a second buried interconnect inside the inter-layer insulating layer. The first buried interconnect electrically connects the first conductive layer with the semiconductor substrate. The second buried interconnect electrically connects the second conductive layer with the semiconductor substrate. In addition, the method can include removing the sacrificial layer.

Various embodiments will be described hereinafter with reference to the accompanying drawings.

The drawings are schematic or conceptual; and the proportions of sizes between portions and the like are not necessarily the same as the actual values thereof. The dimensions and the proportions may be illustrated differently among the drawings, even for identical portions.

In the drawings and the specification of the application, components similar to those described in regard to a drawing thereinabove are marked with like reference numerals, and a detailed description is omitted as appropriate.

First Embodiment

FIG. 1 is a schematic perspective view illustrating the configuration of a strain and pressure sensing device according to a first embodiment.

For easier viewing in FIG. 1, the insulating portions are not illustrated, and mainly the conductive portions are illustrated.

As shown in FIG. 1, the strain and pressure sensing device 310 according to the embodiment includes a semiconductor circuit unit 110 and a sensing unit 120.

The semiconductor circuit unit 110 includes a semiconductor substrate 111 and a transistor 112.

The semiconductor substrate 111 includes a major surface 111a of the semiconductor substrate 111. The semiconductor substrate 111 includes an element region 111b provided in the major surface 111a. The transistor 112 is provided in the element region 111b.

The semiconductor circuit unit 110 may include a processing circuit 113. The processing circuit 113 may be provided in the element region 111b or may be provided in a region other than the element region 111b. The processing circuit 113 is provided at any location of the semiconductor circuit unit 110. The processing circuit 113 may include the transistor 112 provided in the element region 111b.

The sensing unit 120 is provided on the semiconductor circuit unit 110.

The sensing unit 120 includes a space portion 70 and a non-space portion 71. The space portion 70 is provided above the transistor 112. The space portion 70 is provided at least on the element region 111b. The non-space portion 71 is juxtaposed with the space portion 70 in a plane parallel to the major surface 111a.

The space portion 70 is a portion where the material of the non-space portion 71 is not provided. The interior of the space portion 70 may be a vacuum (a low-pressure state lower than 1 atmosphere); and a gas such as air, an inert gas, and the like may be filled into the space portion 70. Or, a liquid may be filled into the space portion 70. A deformable substance may be disposed inside the space portion 70 such that the movable portion described below can move.

Herein, a plane parallel to the major surface 111a is taken as an X-Y plane. A direction perpendicular to the X-Y plane is taken as a Z-axis direction. The sensing unit 120 is stacked with the semiconductor circuit unit 110 along the Z-axis direction.

The non-space portion 71 may be provided around the space portion 70.

The sensing unit 120 includes a movable beam 60, a strain sensing element unit 50, a first buried interconnect 61c, and a second buried interconnect 62c.

The movable beam 60 includes a fixed portion 63 and a movable portion 64. The movable beam 60 includes a first interconnect layer 61 and a second interconnect layer 62.

The fixed portion 63 is fixed to the non-space portion 71. The movable portion 64 extends from the fixed portion 63 into the space portion 70. The movable portion 64 is separated from the transistor 112. The distance between the movable portion 64 and the transistor 112 is changeable. The first interconnect layer 61 and the second interconnect layer 62 extend from the fixed portion 63 toward the movable portion 64.

In this example, the movable beam 60 extends along the X-axis direction (one direction in the X-Y plane). In other words, the direction from the fixed portion 63 toward the movable portion 64 is along the X-axis direction. An axis perpendicular to the X-axis direction and perpendicular to the Z-axis direction is taken as a Y-axis direction.

The strain sensing element unit 50 is fixed to the movable portion 64. One end of the strain sensing element unit 50 is electrically connected to the first interconnect layer 61. One other end of the strain sensing element unit 50 is electrically connected to the second interconnect layer 62. The strain sensing element unit 50 includes the first magnetic layer described below.

The first buried interconnect 61c is provided in the non-space portion 71. The first buried interconnect 61c electrically connects the end of the first interconnect layer 61 on the fixed portion 63 side to the semiconductor circuit unit 110.

The second buried interconnect 62c is provided in the non-space portion 71. The second buried interconnect 62c electrically connects the end of the second interconnect layer 62 on the fixed portion 63 side to the semiconductor circuit unit 110.

For example, the first buried interconnect 61c and the second buried interconnect 62c have portions along the Z-axis direction.

In the strain and pressure sensing device 310 according to the embodiment, the distance between the movable portion 64 and the transistor 112 is changeable. The amount of the strain applied to the strain sensing element unit 50 changes according to the change of this distance; and the magnetization direction of the first magnetic layer changes according to this change of the amount of strain. The electrical resistance between the one end and the one other end of the strain sensing element unit 50 changes according to this change of the magnetization direction. This change of the electrical resistance is based on, for example, a MR effect. Thereby, the strain can be sensed with high sensitivity for a micro region.

In this example, the movable portion 64 includes a diaphragm unit 61b stacked with the first interconnect layer 61. In this example, the first interconnect layer 61 extends onto a portion of the diaphragm unit 61b.

In the specification of the application, the state of being stacked includes both the state of being directly overlaid and the state of being overlaid with another component inserted therebetween. Further, the state of being provided on a component includes both the state of being disposed in contact with the component and the state of being disposed on the component with another component inserted therebetween.

The surface area of the diaphragm unit 61b is greater than the surface area of the first interconnect layer 61. By providing the diaphragm unit 61b, the external force from the outside is efficiently transmitted to the strain sensing element unit 50. Thereby, the sensitivity of the strain sensing increases. By providing the diaphragm unit 61b, the relationship between the external force and the strain is constant because the strain sensing is possible on a structure having a regulated configuration. For example, the conversion from the amount of strain to the external force is unique and easy to use.

In this example, a strain resistance change unit 50s and bias layers 55a and 55b (e.g., hard bias layers) that apply a bias magnetic field to the strain resistance change unit 50s are provided in the strain sensing element unit 50. The bias layers 55a and 55b may be provided if necessary and may be omitted in some cases. The bias layers 55a and 55b are described below. The strain resistance change unit 50s will now be described.

Figure 2:
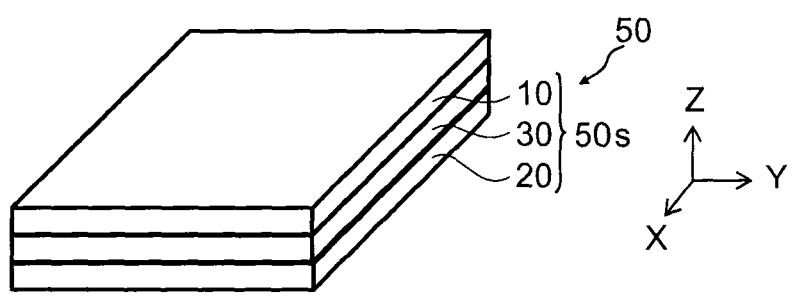
FIG. 2 is a schematic perspective view showing a portion of the strain and pressure sensing device according to the first embodiment.

FIG. 2 is a schematic perspective view illustrating the configuration of a portion of the strain and pressure sensing device according to the first embodiment.

As shown in FIG. 2, the strain resistance change unit 50s (the strain sensing element unit 50) includes, for example, a first magnetic layer 10, a second magnetic layer 20, and an intermediate layer 30 provided between the first magnetic layer 10 and the second magnetic layer 20. The intermediate layer 30 is a nonmagnetic layer.

In this example, the first magnetic layer 10 is a magnetization free layer. The second magnetic layer 20 is, for example, a magnetization fixed layer or a magnetization free layer.

Hereinbelow, an example of the operation of the strain sensing element unit 50 is described as a case where the second magnetic layer 20 is a magnetization fixed layer and the first magnetic layer 10 is a magnetization free layer. In the strain sensing element unit 50, an "inverse magnetostrictive effect" of the ferromagnet and a "MR effect" arising in the strain resistance change unit 50s are utilized.

The "MR effect" is a phenomenon in which the value of the electrical resistance of the stacked film changes due to the change of the magnetization of a magnetic body when an external magnetic field is applied to a stacked film including the magnetic body. This includes a GMR (Giant magnetoresistance) effect, a TMR (Tunneling magnetoresistance) effect, and the like. The MR effect arises by the change of the relative angle of the orientation of the magnetization being read as an electrical resistance change by causing a current to flow in the strain resistance change unit 50s. For example, a tensile stress is applied to the strain resistance change unit 50s based on the stress applied to the strain sensing element unit 50. When the orientation of the magnetization of the first magnetic layer 10 (the magnetization free layer) is different from the direction of the tensile stress applied to the second magnetic layer 20, the MR effect arises due to the inverse magnetostrictive effect. ΔR/R is called the MR change rate, where R is the resistance of the low resistance state, and ΔR is the change amount of the electrical resistance changing due to the MR effect.

Figures 3A, 3B, 3C:
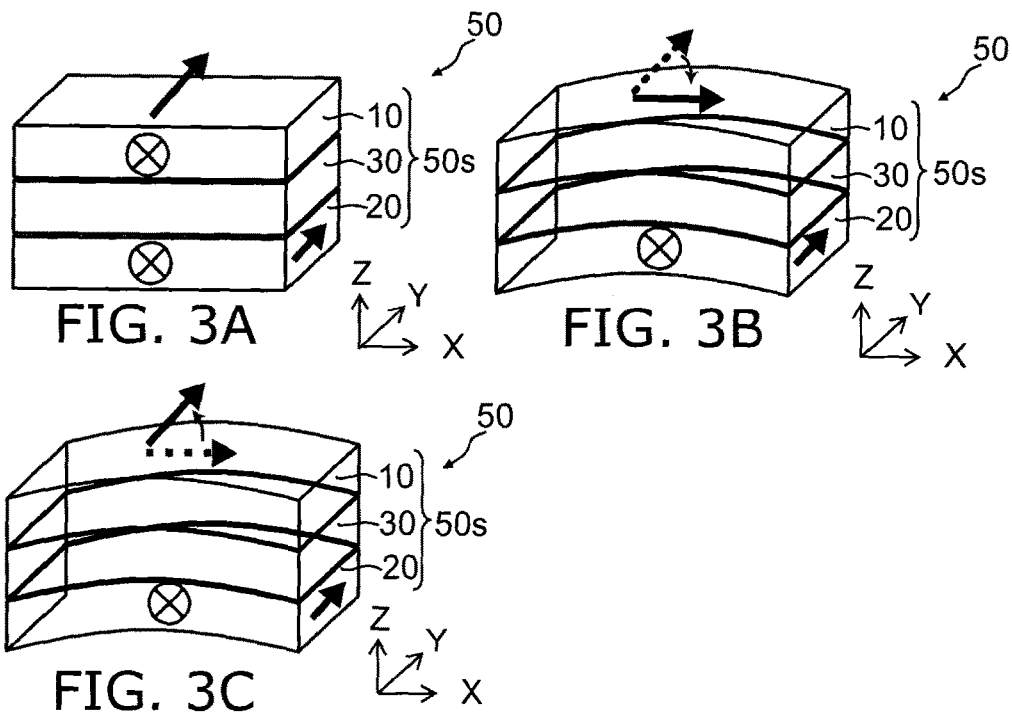
FIG. 3A to FIG. 3C are schematic perspective views showing operations of the strain and pressure sensing device according to the first embodiment.

FIG. 3A to FIG. 3C are schematic perspective views illustrating operations of the strain and pressure sensing device according to the first embodiment.

These drawings illustrate the state of the strain sensing element unit 50. These drawings illustrate the relationship between the direction of the magnetization and the direction of the tensile stress for the strain sensing element unit 50.

FIG. 3A shows the state in which the tensile stress is not applied. At this time, in this example, the orientation of the magnetization of the second magnetic layer 20 (the magnetization fixed layer) is the same as the orientation of the magnetization of the first magnetic layer 10 (the magnetization free layer).

FIG. 3B shows the state in which the tensile stress is applied. In this example, the tensile stress is applied along the X-axis direction. For example, the tensile stress is applied along the X-axis direction due to, for example, deformation of the movable portion 64. In other words, the tensile stress is applied in a direction orthogonal to the orientation (in this example, the Y-axis direction) of the magnetizations of the second magnetic layer 20 (the magnetization fixed layer) and the first magnetic layer 10 (the magnetization free layer). At this time, the magnetization of the first magnetic layer 10 (the magnetization free layer) rotates to be in the same direction as the direction of the tensile stress. This is called the "inverse magnetostrictive effect". At this time, the magnetization of the second magnetic layer 20 (the magnetization fixed layer) is fixed. Therefore, the relative angle between the orientation of the magnetization of the second magnetic layer 20 (the magnetization fixed layer) and the orientation of the magnetization of the first magnetic layer 10 (the magnetization free layer) changes by the magnetization of the first magnetic layer 10 (the magnetization free layer) rotating.

In these drawings, the direction of the magnetization of the second magnetic layer 20 (the magnetization fixed layer) is illustrated as an example; and the directions of the magnetizations may be different from the directions shown in these drawings.

In the inverse magnetostrictive effect, the easy magnetization axis changes according to the sign of the magnetostriction constant of the ferromagnet. In many materials having large inverse magnetostrictive effects, the magnetostriction constant has a positive sign. In the case where the magnetostriction constant has a positive sign, as described above, the direction in which the tensile stress is applied becomes the easy magnetization axis. In such a case, as recited above, the magnetization of the first magnetic layer 10 (the magnetization free layer) rotates in the direction of the easy magnetization axis.

For example, in the case where the magnetostriction constant of the first magnetic layer 10 (the magnetization free layer) is positive, the direction of the magnetization of the first magnetic layer 10 (the magnetization free layer) is set to be in a direction different from the direction in which the tensile stress is applied.

On the other hand, in the case where the magnetostriction constant is negative, a direction perpendicular to the direction in which the tensile stress is applied becomes the easy magnetization axis.

FIG. 3C illustrates the state in the case where the magnetostriction constant is negative. In such a case, the direction of the magnetization of the first magnetic layer 10 (the magnetization free layer) is set to be in a direction different from a direction perpendicular to the direction (in this example the X-axis direction) in which the tensile stress is applied.

In these drawings, the direction of the magnetization of the second magnetic layer 20 (the magnetization fixed layer) is illustrated as an example; and the directions of the magnetizations may be different from the directions shown in these drawings.

For example, electrical resistance of the strain sensing element unit 50 (the strain resistance change unit 50s) changes due to the MR effect according to the angle between the magnetization of the first magnetic layer 10 and the magnetization of the second magnetic layer 20.

The magnetostriction constant ($\lambda s$) indicates the size of the shape deformation when the ferromagnetic layer has saturation magnetization in some direction by applying an external magnetic field. For a length L in the state in which there is no external magnetic field, a magnetostriction constant $\lambda s$ is $\Delta L/L$, where the length changes by an amount $\Delta L$ when the external magnetic field is applied. Although this change amount varies with the size of the magnetic field, the magnetostriction constant $\lambda s$ is the value $\Delta L/L$ of the state in which a sufficient magnetic field is applied and the magnetization is saturated.

For example, in the case where the second magnetic layer 20 is the magnetization fixed layer, the second magnetic layer 20 may include, for example, a CoFe alloy, a CoFeB alloy, a NiFe alloy, and the like. The thickness of the second magnetic layer 20 is, for example, not less than 2 nanometers (nm) and not more than 6 nm.

The intermediate layer 30 may include a metal or an insulator. For example, Cu, Au, Ag, and the like may be used as the metal. In the case of being a metal, the thickness of the intermediate layer 30 is, for example, not less than 1 nm and not more than 7 nm. For example, magnesium oxide (MgO, etc.), aluminum oxide ($Al_2O_3$, etc.), titanium oxide (TiO, etc.), and zinc oxide (ZnO, etc.) may be used as the insulator. In the case of being an insulator, the thickness of the intermediate layer 30 is, for example, not less than 0.6 nm and not more than 2.5 nm.

In the case where the first magnetic layer 10 is the magnetization free layer, the first magnetic layer 10 may include, for example, an FeCo alloy, a NiFe alloy, and the like. Other than these, the first magnetic layer 10 may include an Fe—Co—Si—B alloy, a Tb-M-Fe alloy with $\lambda s>100$ ppm (M being Sm, Eu, Gd, Dy, Ho, and Er), a Tb-M1-Fe-M2 alloy (M1 being Sm, Eu, Gd, Dy, Ho, and Er and M2 being Ti, Cr, Mn, Co, Cu, Nb, Mo, W, and Ta), an Fe-M3-M4-B alloy (M3 being Ti, Cr, Mn, Co, Cu, Nb, Mo, W, and Ta and M4 being Ce, Pr, Nd, Sm, Tb, Dy, and Er), Ni, Al—Fe, ferrite ($Fe_3O_4$, $(FeCo)_3O_4$, etc.) and the like. The thickness of the first magnetic layer 10 is, for example, not less than 2 nm.

The first magnetic layer 10 may have a two-layer structure. In such a case, the first magnetic layer 10 may include a layer of an FeCo alloy or one of the following layers stacked with a layer of an FeCo alloy. A layer of a material selected from an Fe—Co—Si—B alloy, a Tb-M-Fe alloy with $\lambda s>100$ ppm (M being Sm, Eu, Gd, Dy, Ho, and Er), a Tb-M1-Fe-M2 alloy (M1 being Sm, Eu, Gd, Dy, Ho, and Er and M2 being Ti, Cr, Mn, Co, Cu, Nb, Mo, W, and Ta), an Fe-M3-M4-B alloy (M3 being Ti, Cr, Mn, Co, Cu, Nb, Mo, W, and Ta and M4 being Ce, Pr, Nd, Sm, Tb, Dy, and Er), Ni, Al—Fe, ferrite ($Fe_3O_4$, $(FeCo)_3O_4$, etc.) and the like may be stacked with a layer of the FeCo alloy.

For example, in the case where the intermediate layer 30 is a metal, a GMR (Giant Magnetoresistance) effect arises. In the case where the intermediate layer 30 is an insulator, a TMR (Tunneling Magnetoresistance) effect arises. For example, in the strain sensing element unit 50, a CPP (Current Perpendicular to Plane)-GMR effect may be used in which a current is caused to flow along, for example, the stacking direction of the strain resistance change unit 50s.

The intermediate layer 30 may be a CCP (Current-Confined-Path) spacer layer in which metal current paths having widths (e.g., diameters) not less than about 1 nm and not more than about 5 nm are multiply made in a portion of the insulating layer to pierce the insulating layer in the film thickness direction. In such a case as well, the CCP-GMR effect is used.

Thus, in the embodiment, the inverse magnetostrictive phenomenon is used in the strain sensing element unit 50. Thereby, highly sensitive sensing is possible. In the case where the inverse magnetostrictive effect is used, for example, the magnetization direction of the magnetic layer of at least one selected from the first magnetic layer 10 and the second magnetic layer 20 changes due to the strain applied from the outside. The relative angle of the magnetization of the two magnetic layers changes due to the strain (the application/non-application of the strain, the degree of the strain, and the like) from the outside. The strain sensing element unit 50 functions as a strain sensor because the electrical resistance changes due to the strain applied from the outside.

The strain and pressure sensing device 310 can be applied to a microphone to sense sound. For example, the microphone (the strain and pressure sensing device 310) can include the semiconductor circuit unit 110 and the sensing unit 120 shown in FIG. 1.

Figure 4:
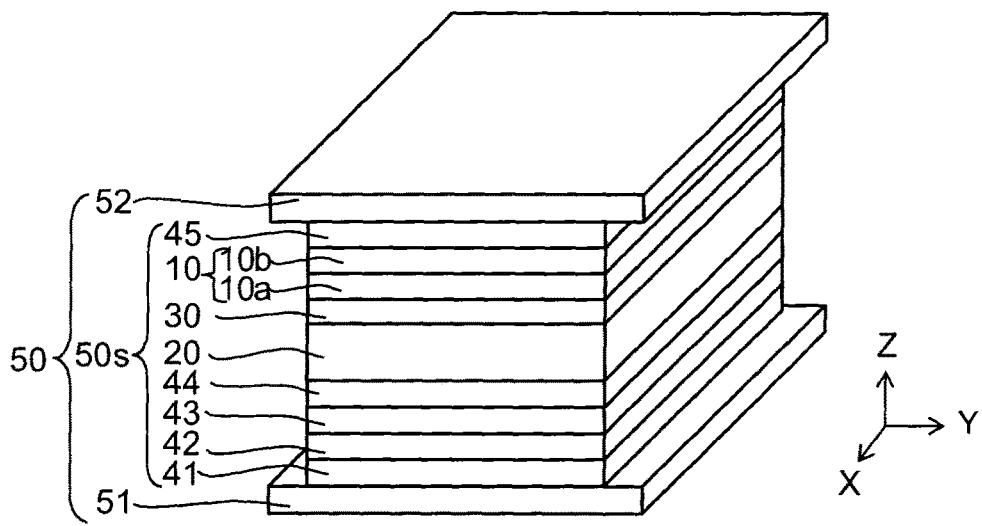
FIG. 4 is a schematic perspective view showing a portion of the strain and pressure sensing device according to the first embodiment.

FIG. 4 is a schematic perspective view illustrating the configuration of a portion of the strain and pressure sensing device according to the first embodiment.

As shown in FIG. 4, the strain sensing element unit 50 includes, for example, a first electrode 51 and a second electrode 52. The strain resistance change unit 50s is provided between the first electrode 51 and the second electrode 52. In this example, a buffer layer 41 (which also is a seed layer having a thickness of several nm), an antiferromagnetic layer 42 (having a thickness of several nm), a magnetic layer 43 (having a thickness of several nm), a Ru layer 44, the second magnetic layer 20 (having a thickness of several nm), the intermediate layer 30 (having a thickness of several nm), the first magnetic layer 10, and a cap layer 45 (having a thickness of several nm) are provided in this order in the strain resistance change unit 50s from the first electrode 51 side toward the second electrode 52.

The second magnetic layer 20 may include, for example, a magnetic stacked film. The first magnetic layer 10 includes a magnetic stacked film 10a (having a thickness of about 1 nm) and a highly magnetostrictive film 10b (having a thickness of several nm) provided between the magnetic stacked film 10a and the cap layer 45.

The first electrode 51 and the second electrode 52 may include, for example, Au, Cu, Ta, Al, and the like which are nonmagnetic bodies. By using a material that is a soft magnetic body as the first electrode 51 and the second electrode 52, magnetic noise from the outside which affects the strain resistance change unit 50s can be reduced. For example, permalloy (a NiFe alloy) and silicon steel (an FeSi alloy) may be used as the material of the soft magnetic body. The strain sensing element unit 50 is covered with an insulator such as aluminum oxide (e.g., $Al_2O_3$), silicon oxide (e.g., $SiO_2$), etc.

The magnetization direction of the magnetic layer of at least one selected from the first magnetic layer 10 and the second magnetic layer 20 changes according to the stress. The absolute value of the magnetostriction constant of the at least one of the magnetic layers (the magnetic layer in which the magnetization direction changes according to the stress) is set to be, for example, not less than $10^{-5}$. Thereby, due to the inverse magnetostrictive effect, the direction of the magnetization changes according to the strain applied from the outside. For example, at least one selected from the first magnetic layer 10 and the second magnetic layer 20 includes a metal such as Fe, Co, Ni, etc., an alloy including such metals, and the like. The magnetostriction constant may be set to be large by selecting the elements, the added elements, and the like that are used.

For example, an oxide such as MgO is used as the intermediate layer 30. The magnetic layer on the MgO layer generally has a positive magnetostriction constant. For example, in the case where the first magnetic layer 10 is formed on the intermediate layer 30, a magnetization free layer having a stacked configuration of CoFeB/CoFe/NiFe is used as the first magnetic layer 10. In the case where the NiFe layer of the uppermost layer is Ni-rich, the magnetostriction constant of the NiFe layer is negative with a greater absolute value. To suppress the cancellation of the positive magnetostriction on the oxide layer, the Ni composition of the NiFe layer of the uppermost layer is not more Ni-rich than is the permalloy composition of $Ni_{81}Fe_{19}$ which is generally used. Specifically, it is favorable for the proportion of the Ni of the NiFe layer of the uppermost layer to be less than 80 atomic percent (atomic %). In the case where the first magnetic layer 10 is the magnetization free layer, it is favorable for the thickness of the first magnetic layer 10 to be, for example, not less than 1 nm and not more than 20 nm.

In the case where the first magnetic layer 10 is the magnetization free layer, the second magnetic layer 20 may be a magnetization fixed layer or a magnetization free layer. In the case where the second magnetic layer 20 is the magnetization fixed layer, the direction of the magnetization of the second magnetic layer 20 substantially does not change even when the strain is applied from the outside. Then, the electrical resistance changes according to the angle of the relative magnetization between the first magnetic layer 10 and the second magnetic layer 20. The application/non-application of the strain is sensed by the difference in the electrical resistance.

In the case where both the first magnetic layer 10 and the second magnetic layer 20 are magnetization free layers, for example, the magnetostriction constant of the first magnetic layer 10 is set to be different from the magnetostriction constant of the second magnetic layer 20.

In both the case where the second magnetic layer 20 is the magnetization fixed layer and the case where the second magnetic layer 20 is the magnetization free layer, it is favorable for the thickness of the second magnetic layer 20 to be, for example, not less than 1 nm and not more than 20 nm.

For example, in the case where the second magnetic layer 20 is the magnetization fixed layer, the second magnetic layer 20 may include a synthetic AF structure using a stacked structure of a diamagnetic layer/magnetic layer/Ru layer/magnetic layer and the like. The diamagnetic layer may include, for example, IrMn and the like. As described below, a hard bias layer may be provided.

The strain sensing element unit 50 uses the spin of the magnetic layers. The surface area that is necessary for the strain sensing element unit 50 may be extremely small. It is sufficient for the surface area of the strain sensing element unit 50 to be, for example, not more than about 10 nm by 10 nm to 20 nm by 20 nm.

For example, the length of the strain sensing element unit 50 along the X-axis direction (the first direction from the fixed portion 63 toward the movable portion 64) is not less than 20 nm and not more than 10 μm. It is favorable for the length of the strain sensing element unit 50 along the X-axis direction to be not less than 100 nm and not more than 5 μm.

For example, the length of the strain sensing element unit 50 along the Y-axis direction (the direction perpendicular to the X-axis direction and parallel to the X-Y plane) is not less than 20 nm and not more than 10 μm. It is favorable for the length of the strain sensing element unit 50 along the Y-axis direction to be not less than 100 nm and not more than 5 μm.

For example, the length of the strain sensing element unit 50 along the Z-axis direction (the direction perpendicular to the X-Y plane) is not less than 20 nm and not more than 100 nm.

The length of the strain sensing element unit 50 along the X-axis direction may be the same as or different from the length of the strain sensing element unit 50 along the Y-axis direction. In the case where the length of the strain sensing element unit 50 along the X-axis direction is different from the length of the strain sensing element unit 50 along the Y-axis direction, shape magnetic anisotropy occurs. Thereby, effects that are similar to the effects obtained using the hard bias layer can be obtained.

The orientation of the current flowing in the strain sensing element unit 50 may be in the direction from the first magnetic layer 10 toward the second magnetic layer 20 and may be in the direction from the second magnetic layer 20 toward the first magnetic layer 10.

Figure 5:
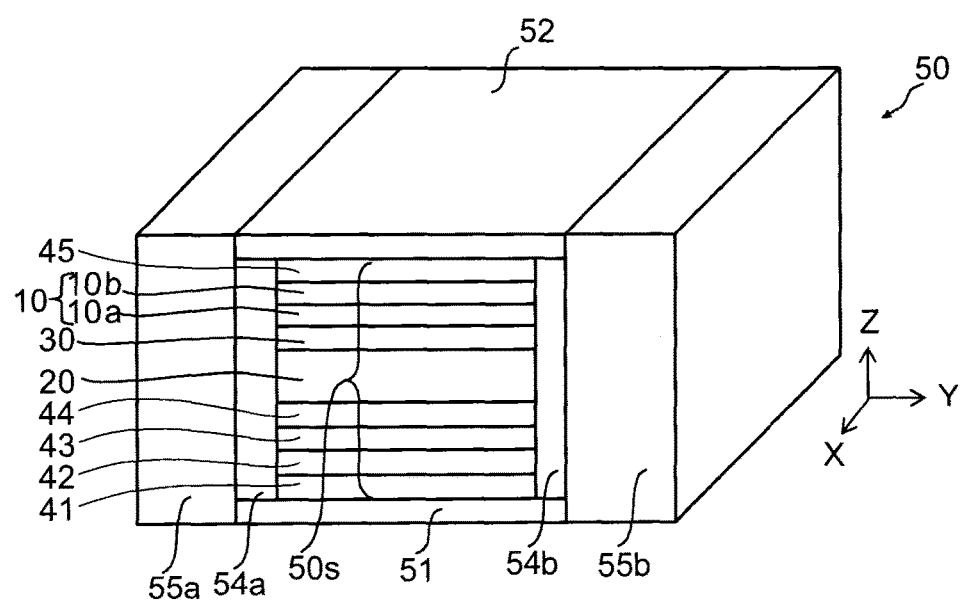
FIG. 5 is a schematic perspective view showing a portion of the strain and pressure sensing device according to the first embodiment.

FIG. 5 is a schematic perspective view illustrating the configuration of a portion of the strain and pressure sensing device according to the first embodiment.

In this example as shown in FIG. 5, the strain sensing element unit 50 further includes the bias layers 55a and 55b (the hard bias layers). The bias layers 55a and 55b are provided to oppose the strain resistance change unit 50s.

In this example, the second magnetic layer 20 is a magnetization fixed layer. The bias layers 55a and 55b are juxtaposed with the second magnetic layer 20. The strain resistance change unit 50s is disposed between the bias layers 55a and 55b. An insulating layer 54a is provided between the bias layer 55a and the strain resistance change unit 50s. An insulating layer 54b is provided between the bias layer 55b and the strain resistance change unit 50s.

The bias layers 55a and 55b apply a bias magnetic field to the first magnetic layer 10. Thereby, it is possible to bias the magnetization direction of the first magnetic layer 10 to the appropriate position; and a single domain is possible.

The sizes of the bias layers 55a and 55b (in this example, the lengths along the Y-axis direction) are, for example, not less than 100 nm and not more than 10 μm.

The sizes of the insulating layers 54a and 54b (in this example, the lengths along the Y-axis direction) are, for example, not less than 1 nm and not more than 5 nm.

In the strain and pressure sensing device 310 according to the embodiment, the strain sensing element unit 50 is formed above the substrate on which the transistor 112 is formed. The transistor 112 and the strain sensing element unit 50 are connected not by wires such as those of a mounting process but by interconnect layers formed as part of the wafer manufacturing processes. Thereby, it becomes possible to downsize the strain and pressure sensing device; and the strain can be sensed with high sensitivity for a micro region.

By forming the transistor and the strain sensing element unit on a common substrate, for example, a circuit (the processing circuit 113 and the like) such as an arithmetic circuit, an amplifier circuit, a communication circuit, and the like configured to process the information obtained by the sensor can be formed on the same substrate as the strain sensing element unit 50. By forming a highly sensitive sensor integrally with the arithmetic circuit, downsizing of the system as an entirety can be realized. Also, power consumption can be reduced.

In the embodiment, for example, a highly sensitive sensor is used; and the embodiment is realized as a system on a chip in which the circuit configured to perform the processing of the signal obtained by the sensor is on a common substrate.

In the case where the movable portion 64 (the diaphragm unit 61b) is provided above the transistor 112, the realistically-obtainable range of movement (the distance along the Z-axis direction) is not more than 10 μm. Actually, it is easier to provide even smaller ranges of movement. An extremely highly sensitive strain sensor becomes necessary to accurately measure the strain in the case of such a small range of movement. Also, it is desirable for the surface area of the diaphragm to be small to accurately measure the pressure for a micro-contact state. Unless the film thickness of the diaphragm is thin, the deflection amount undesirably decreases as the diaphragm becomes smaller; and it is impossible to measure with high sensitivity. Because the film thickness of the diaphragm cannot be made to be too thin when used as a pressure sensor without being easily destroyed by the external environment, the sensitivity of the pressure sensor also undesirably decreases as the diaphragm diameter decreases.

Thus, a highly-sensitive strain sensor is desirable to realize the two circumstances of the vertical range of movement of the diaphragm being small and the diameter of the diaphragm being small. Such high sensitivity is possible in the strain sensing element unit 50 according to the embodiment to satisfy these requirements.

In the strain sensing element unit 50 according to the embodiment, a high strain sensitivity a that substantially does not depend on the element size can be realized even for a small element surface area. The strain sensitivity α is, for example, $\alpha=(\Delta R/R\min)/\epsilon$. Rmin is the resistance in the low state; and ΔR is the resistance change amount. ε is the strain which is ΔI/I. Here, I is the initial length; and ΔI is the displacement amount.

The strain sensitivity a is determined by the material used; and in the case of a piezoresistive strain sensor using, for example, Si, the strain sensitivity α is, for example, about 130. In the case of the piezoresistive strain sensor using Si, the necessary surface area of the element is that of an element in which one side is about 100 μm. The strain sensitivity α per unit surface area is, for example, $130/100 \mu m^2$ which is about $10^{10}$.

On the other hand, in the case of the strain sensing element unit 50 according to the embodiment (the spin strain sensor), there is no upper limit on the strain sensitivity α; and a strain sensitivity of about 1000 can be easily realized. The element surface area necessary to realize such a strain sensitivity a is that of an element in which one side is about 20 nm. Therefore, for example, the strain sensitivity a per unit surface area is about $10^{17}$. Thus, in the embodiment, the sensitivity per unit surface area can be about $10^7$ times that of a pressure sensor having a conventional MEMS structure using Si (a Si-MEMS (Micro Electro Mechanical Systems)).

According to the embodiment, by using spin strain sensor technology, it is possible to obtain high strain sensitivity and realize a strain/pressure sensor in which, for example, the arithmetic circuit is provided together with the sensor.

Figure 6A:
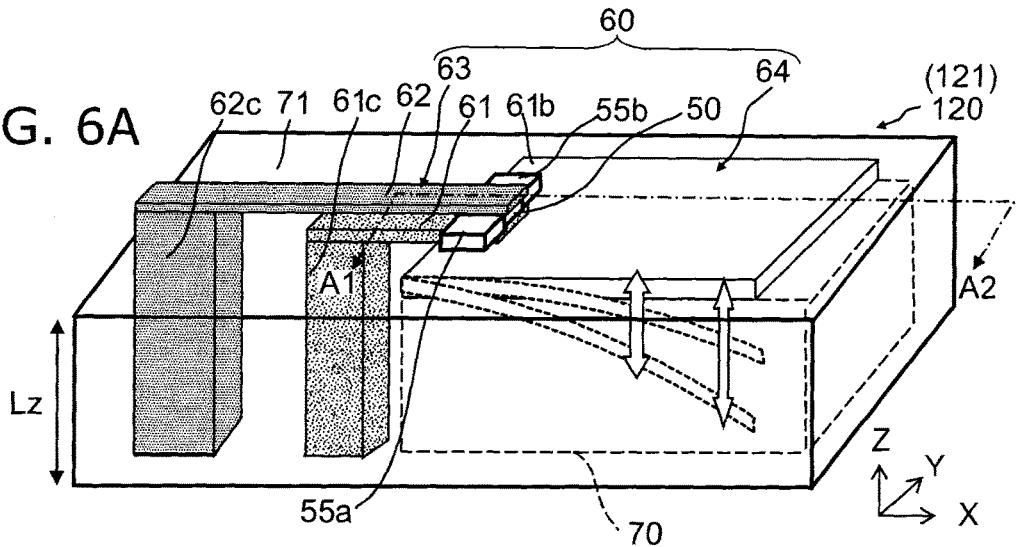
FIG. 6A to FIG. 6C are schematic views showing a portion of the strain and pressure sensing device according to the first embodiment.
Figure 6B:
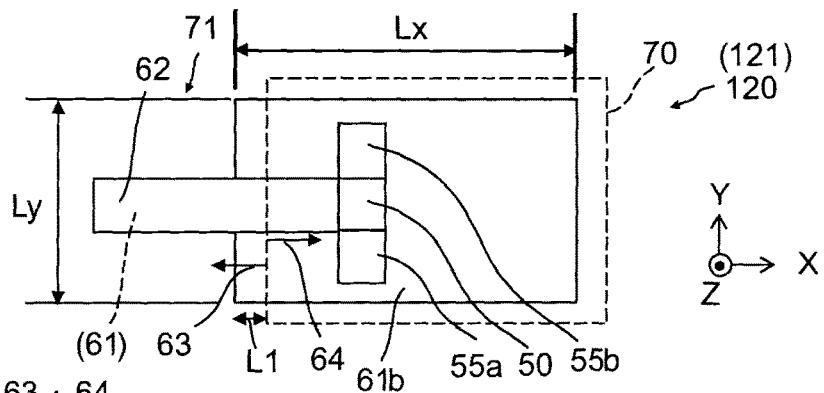
Figure 6C:
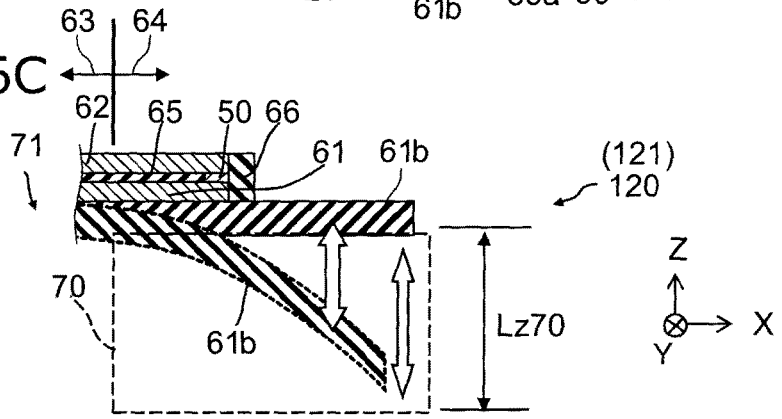

FIG. 6A to FIG. 6C are schematic views illustrating the configuration of a portion of the strain and pressure sensing device according to the first embodiment.

These drawings illustrate the configuration of a sensing unit 121 which is one example of the sensing unit 120. FIG. 6A is a perspective view. FIG. 6B is a plan view. FIG. 6C is a cross-sectional view of line A1-A2 of FIG. 6A.

As shown in FIG. 6A, the movable portion 64 moves along the Z-axis direction inside the space portion 70. A thickness Lz (the length along the Z-axis direction) of the sensing unit 121 (the sensing unit 120) is, for example, not less than 1 μm and not more than 10 μm. In this example, the diaphragm unit 61b is provided. The size of the movable portion 64 is the size of the diaphragm unit 61b.

As shown in FIG. 6B, the movable portion 64 includes the diaphragm unit 61b. The width of the diaphragm unit 61b along the Y-axis direction (the direction parallel to the major surface 111a and perpendicular to the X-axis direction from the fixed portion 63 toward the movable portion 64) is wider than the widths of the first interconnect layer 61 and the second interconnect layer 62 along the Y-axis direction.

A length Lx of the movable portion 64 along the X-axis direction (corresponding to the length of the diaphragm unit 61b along the X-axis direction) is not less than 10 μm and not more than 500 μm. It is favorable for the length Lx to be not less than 50 μm and not more than 200 μm. A length Ly of the movable portion 64 along the Y-axis direction (corresponding to the length of the diaphragm unit 61b along the Y-axis direction) is not less than 10 μm and not more than 500 μm. It is favorable for the length Ly to be not less than 50 μm and not more than 200 μm.

It is favorable for the length Lx to be not less than the length Ly. For example, the length Lx is not less than 1.5 times the length Ly and not more than 5 times the length Ly.

A portion of the diaphragm unit 61*b* may be fixed to the non-space portion 71 as the fixed portion 63. A width L1 (the width along the X-axis direction) of the portion of the diaphragm unit 61*b* fixed to the non-space portion 71 is, for example, not less than 1/10 of the length Lx and not more than 1/3 is of the length Lx.

As shown in FIG. 6C, the movable portion 64 (the diaphragm unit 61*b*) deflects along the Z-axis direction. The height Lz70 of the space portion 70 along the Z-axis direction is, for example, not less than 1 μm and not more than 10 μm. The movable portion 64 moves inside the space portion 70. The distance (the distance along the Z-axis direction) of the movement of the tip of the movable portion 64 (the diaphragm unit 61*b*) along the Z-axis direction is, for example, not less than 1 μm and not more than 10 μm. The distance between the movable portion 64 and the transistor 112 (the semiconductor circuit unit 110) changes, for example, in a range not less than 1 μm and not more than 10 μm.

Stress is applied to the strain sensing element unit 50 according to the movement of the movable portion 64 (the diaphragm unit 61*b*). The electrical resistance of the strain sensing element unit 50 changes according to this stress.

The electrical resistance is sensed by causing a current to flow in the strain sensing element unit 50 via the first buried interconnect 61*c*, the second buried interconnect 62*c*, the first interconnect layer 61, and the second interconnect layer 62. Thereby, the stress applied to the movable portion 64 (the diaphragm unit 61*b*) is sensed. In other words, the strain applied to the strain and pressure sensing device 310 is sensed.

The first buried interconnect 61*c*, the second buried interconnect 62*c*, the first interconnect layer 61, and the second interconnect layer 62 may include, for example, a metal such as Cu, Al, and the like.

The diaphragm unit 61*b* may include, for example, a single-layer film or a stacked film of $SiO_2$, amorphous Si, various oxides, various nitrides and the like. As described below, the first interconnect layer 61 (at least one selected from the first interconnect layer 61 layer and the second interconnect layer 62) also may function as the diaphragm unit 61*b*. In such a case, the diaphragm unit 61*b* (the first interconnect layer 61) may include a metal such as Cu, Al, and the like. Thus, in the embodiment, a configuration is employed in which a diaphragm is provided together with the transistor 112.

On the other hand, in a conventional Si-MEMS, an SOI (Silicon on insulator) substrate is used. In such a case, the back surface of the substrate (the Si monocrystalline substrate) on which the SOI is provided is selectively removed; the oxide film of the SOI becomes the diaphragm; and the silicon film of the SOI becomes the active unit. Because the approach for a conventional configuration is to use an SOI substrate, the materials of the films that can be used are limited to the oxide film and the silicon film formed on the oxide film. This is because it is necessary to perform etching by an RIE (Reactive Ion Etching) process and the like to use monocrystalline Si as the strain sensor. In the conventional approach, it is necessarily exceedingly difficult to form the diaphragm on a transistor formed on the substrate because the process of etching is performed from the substrate back surface. Thus, in the case where monocrystalline Si is used as the strain sensor, the material of the diaphragm is extremely limited and is necessarily limited to the materials described above.

Conversely, in the embodiment, a sacrificial layer which is described below is formed on the transistor 112; and the movable portion 64 is formed on the sacrificial layer. For example, the film formed on the sacrificial layer which is formed on the transistor 112 may be used as the diaphragm unit 61*b*. Therefore, it is possible to use any material as the diaphragm unit 61*b*. Thereby, by appropriately selecting the material, the diaphragm characteristics can be improved; and, for example, the stress of the diaphragm unit 61*b* can be substantially zero. Although it is exceedingly difficult to form monocrystalline Si on a diaphragm formed on a base body other than an SOI substrate, such a formation is possible in a spin strain sensor.

In the embodiment, a configuration is employed in which the movable portion 64 is formed on the sacrificial layer, and the sacrificial layer is removed from the upper surface of the sacrificial layer. In such a case, the range of movement of the movable portion 64 is limited compared to the Si-MEMS using the SOI substrate because a thick sacrificial layer is difficult to form. In other words, the movable amount of the diaphragm is small; and the strain change amount decreases. The inventor of the application considered that a spin strain sensor may function sufficiently as a sensor even in the case where the movable amount of the diaphragm is small because a high strain sensitivity is realizable.

The thickness of the diaphragm unit 61*b* is, for example, not less than 100 nm and not more than 3 μm. It is favorable for the thickness of the diaphragm unit 61*b* to be not less than 200 nm and not more than 2 μm. The thickness of the diaphragm unit 61*b* may be not less than 10 nm and not more than 1 μm. This can makes the sensitivity higher and/or the down-scaling.

As shown in FIG. 6C, an insulating layer 65 (e.g., a $SiO_2$ layer and the like) is provided between the first interconnect layer 61 and the second interconnect layer 62. An insulating layer 66 (e.g., a $SiO_2$ layer and the like) is provided in contact with the end portion of the first interconnect layer 61 on the movable portion 64 side and the end portion of the second interconnect layer 62 on the movable portion 64 side.

By using the sensing unit 120 (the sensing unit 121) having such a configuration, the strain can be sensed with high sensitivity for a micro region.

Although the configurations of the movable portion 64 (e.g., the diaphragm unit 61*b*) and the space portion 70 are substantially rectangular as viewed along the Z-axis direction in this example, the embodiment is not limited thereto. These configurations are arbitrary.

Figure 7A:
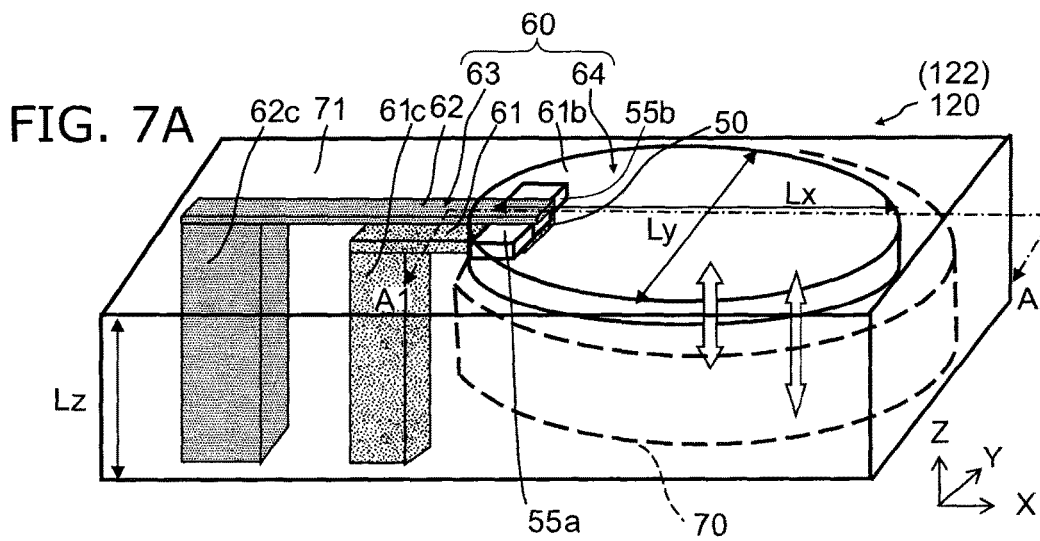
FIG. 7A to FIG. 7C are schematic views showing a portion of the strain and pressure sensing device according to the first embodiment.
Figure 7B:
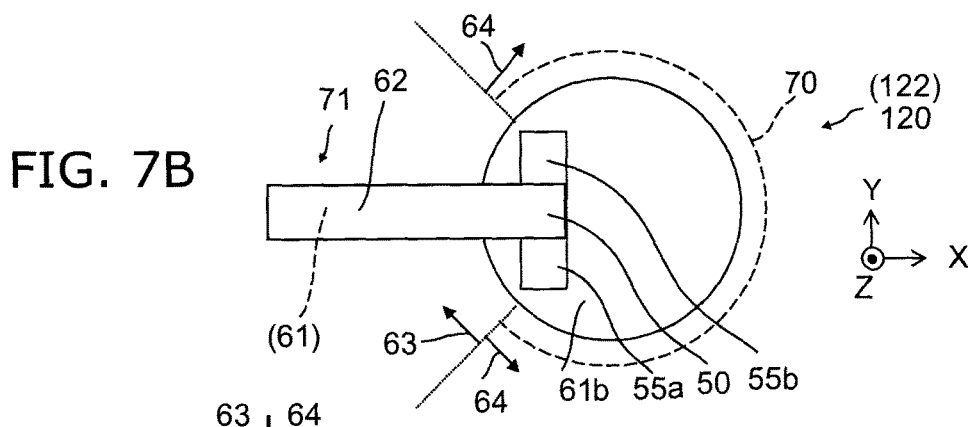
Figure 7C:
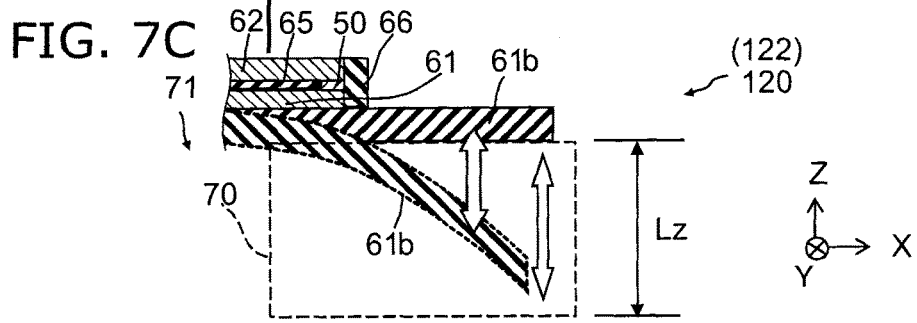

FIG. 7A to FIG. 7C are schematic views illustrating the configuration of a portion of the strain and pressure sensing device according to the first embodiment.

These drawings illustrate the configuration of a sensing unit 122 which is one example of the sensing unit 120. FIG. 7A is a perspective view. FIG. 7B is a plan view. FIG. 7C is a cross-sectional view of line A1-A2 of FIG. 7A.

In this example as shown in FIG. 7A to FIG. 7C, the configuration of the movable portion 64 (e.g., the diaphragm unit 61*b*) is substantially circular (including flattened circular) when viewed along the Z-axis direction. The configuration of the space portion 70 also is substantially circular (including flattened circular) as viewed along the Z-axis direction.

In such a case as well, the strain can be sensed with high sensitivity for a micro region.

Figure 8A:
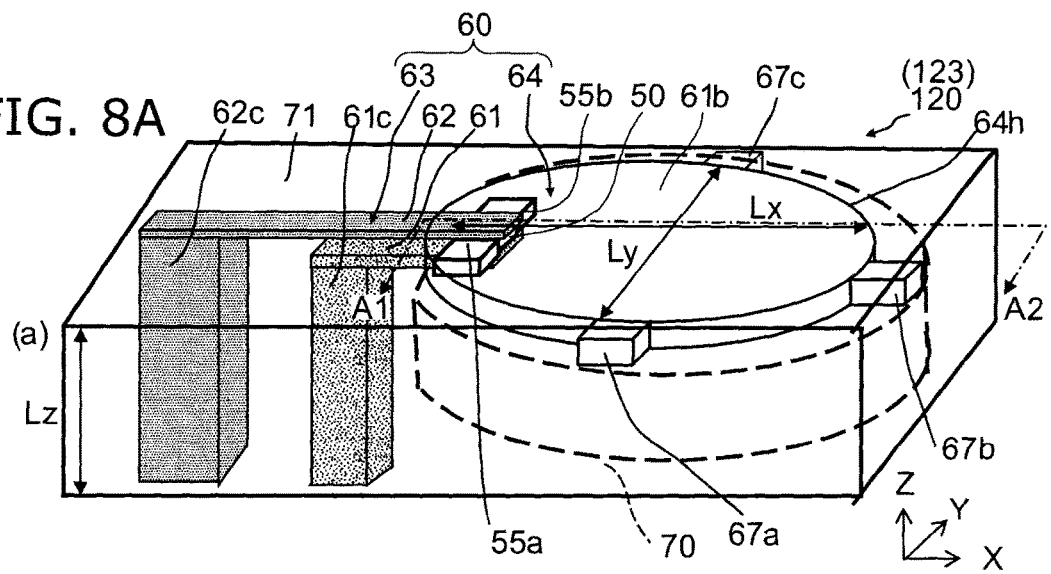
FIG. 8A to FIG. 8C are schematic views showing a portion of the strain and pressure sensing device according to the first embodiment.
Figure 8B:
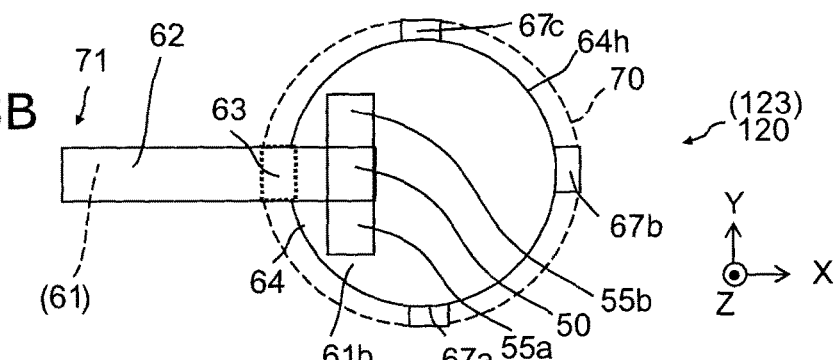
Figure 8C:
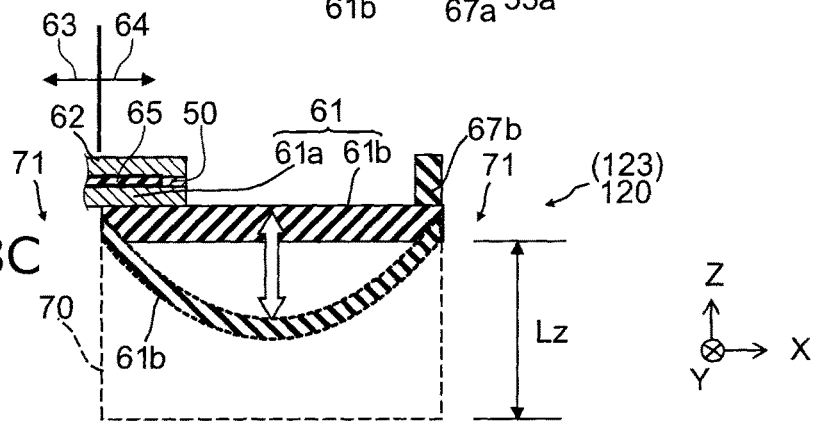

FIG. 8A to FIG. 8C are schematic views illustrating the configuration of a portion of the strain and pressure sensing device according to the first embodiment.

These drawings illustrate the configuration of a sensing unit 123 which is one example of the sensing unit 120. FIG.

8A is a perspective view. FIG. 8B is a plan view. FIG. 8C is a cross-sectional view along line A1-A2 of FIG. 8A.

In this example as shown in FIG. 8A to FIG. 8C, one end of the movable portion 64 is connected to the fixed portion 63; and other ends of the movable portion 64 (in this example, three ends) are fixed to the non-space portion 71 by fixing units 67a, 67b, and 67c. The movable portion 64 is supported at four locations by the fixed portion 63 and the three fixing units. The fixing units 67a, 67b, and 67c may include, for example, an insulating layer such as $SiO_2$, etc.

In this configuration as shown in FIG. 8C, the central portion of the movable portion 64 moves along the Z-axis direction.

Although the movable portion 64 is supported at four locations in this example, the movable portion 64 may be considered to have a hole 64h that pierces the movable portion 64.

Thus, the movable portion 64 may be supported at multiple locations. In such a case as well, the strain can be sensed with high sensitivity for a micro region.

In the strain and pressure sensing device 310 according to the embodiment, the shape of the movable portion 64 (e.g., the diaphragm unit 61b) changes when some action from the outside is applied to the movable portion 64 (e.g., the diaphragm unit 61b). Strain occurs in the strain sensing element unit 50 according to this change of the shape; and this strain is sensed as a change of the electrical resistance. The strain and pressure sensing device 310 can be used as, for example, a pressure sensor. Further, the strain and pressure sensing device 310 can be used as an acceleration sensor. The strain and pressure sensing device 310 also can be used as a temperature sensor. In the case of being used as the temperature sensor, the movable portion 64 (e.g., the diaphragm unit 61b) contracts according to the temperature; and the strain due to this contraction is sensed. For example, a highly sensitive temperature sensor can be provided by using a material having a large coefficient of thermal expansion as the movable portion 64 (e.g., the diaphragm unit 61b).

Figure 9:
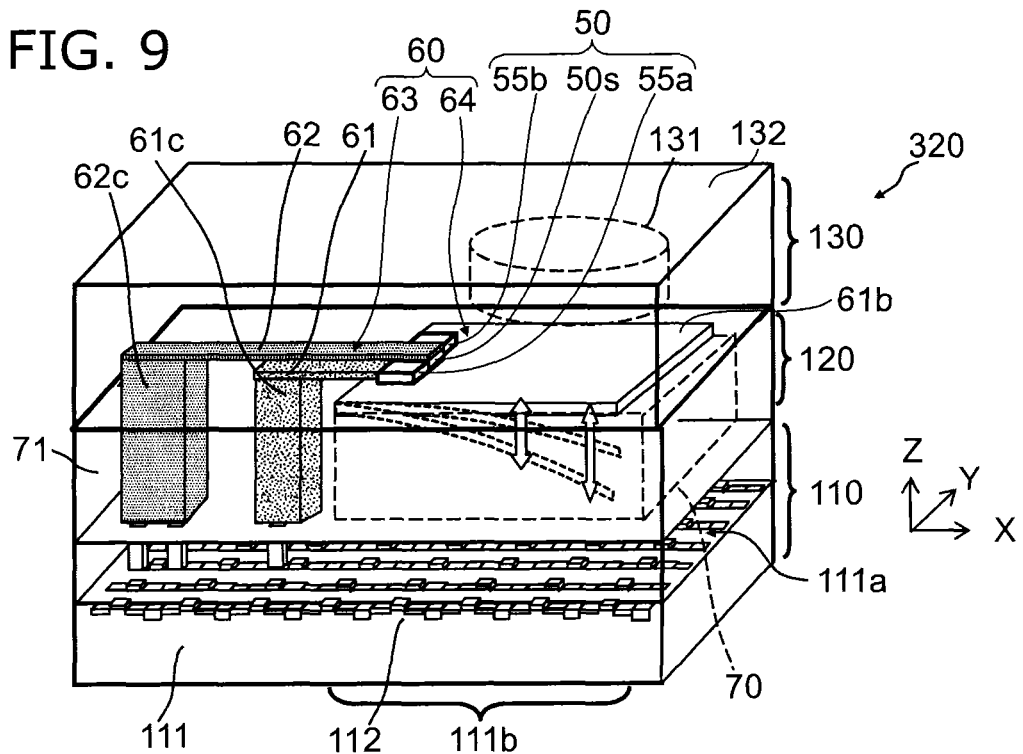
FIG. 9 is a schematic perspective view showing another strain and pressure sensing device according to the first embodiment.

FIG. 9 is a schematic perspective view illustrating the configuration of another strain and pressure sensing device according to the first embodiment. As shown in FIG. 9, the strain and pressure sensing device 320 according to the embodiment further includes a pressure transducer unit 130 provided on the sensing unit 120.

The pressure transducer unit 130 includes a sensor protecting unit 132 and a pressure transducer space portion 131. The pressure transducer space portion 131 is, for example, a portion where the material of the sensor protecting unit 132 is not provided.

Figure 10:
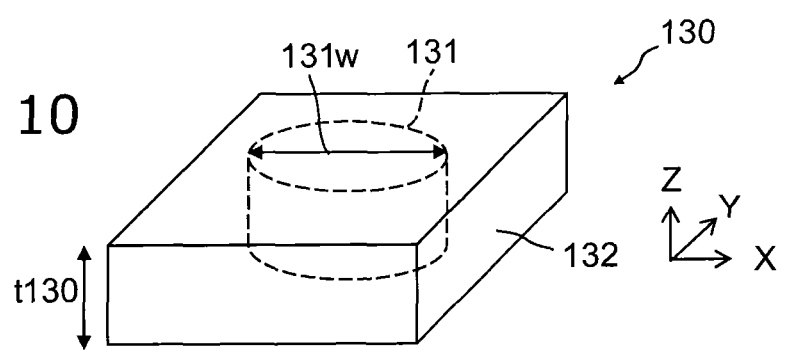
FIG. 10 is a schematic perspective view showing a portion of another strain and pressure sensing device according to the first embodiment.

FIG. 10 is a schematic perspective view illustrating the configuration of a portion of another strain and pressure sensing device according to the first embodiment.

FIG. 10 shows one example of the configuration of the pressure transducer unit 130.

The sensor protecting unit 132 may include, for example, an insulating material such as $Al_2O_3$, $SiO_2$, etc. The configuration of the pressure transducer space portion 131 as viewed in the Z-axis direction conforms to, for example, the configuration of the sensing unit 120 as viewed in the Z-axis direction of the space portion 70. However, the configuration of the pressure transducer space portion 131 is arbitrary. For example, air is filled into the interior of the pressure transducer space portion 131. The pressure transducer space portion 131 transmits, for example, the vibrations of the air to the strain sensing element unit 50.

By applying this configuration, it is also possible to construct a microphone to sense sound. Thus, the strain and pressure sensing device 320 according to the embodiment can be applied to a sensing device configured to sense vibrations of sound and the like in any medium.

By providing the pressure transducer unit 130, the change of the pressure of the outside can be more efficiently transmitted to the strain sensing element unit 50. Thereby, more stable sensing with high precision is possible.

In this example, the configuration of the pressure transducer space portion 131 as viewed in the Z-axis direction is circular (including flattened circular); and a diameter 131w of the pressure transducer space portion 131 is, for example, not more than 1 µm and not less than 500 µm. A thickness t130 of the sensor protecting unit 132 is, for example, not less than 300 nm and not more than 100 µm. However, the embodiment is not limited thereto. These configurations and sizes are arbitrary.

Figure 11:
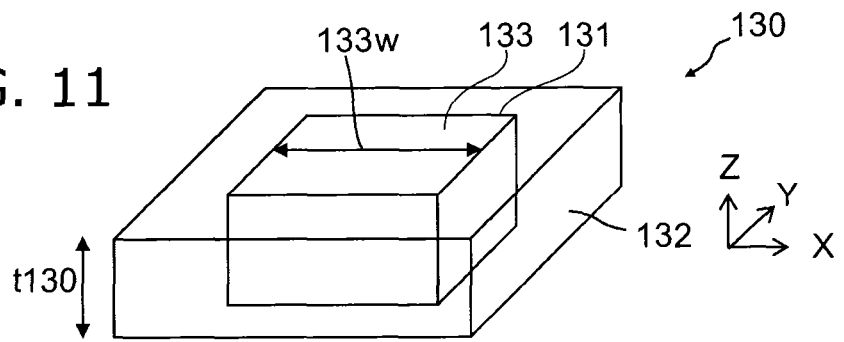
FIG. 11 is a schematic perspective view showing a portion of another strain and pressure sensing device according to the first embodiment.

FIG. 11 is a schematic perspective view illustrating the configuration of a portion of another strain and pressure sensing device according to the first embodiment.

FIG. 11 shows another example of the configuration of the pressure transducer unit 130.

In this example a pressure transducer material 133 is disposed, for example, in the interior of the pressure transducer space portion 131. The pressure transducer material 133 may include, for example, silicone and the like having, for example, a gel or liquid form.

In the case where this configuration is used, for example, mounting is performed in the mounting process of manufacturing the strain and pressure sensing device such that the pressure is transmitted between the pressure transducer unit 130 and the outside.

The processing circuit 113 described in regard to FIG. 1 can, for example, amplify the signal obtained by the strain sensing element unit 50, perform A/D conversion of the sensor signal, and the like. Thus, the semiconductor circuit unit 110 processes the signal based on the current flowing in the strain sensing element unit 50. The processing circuit 113 also can perform processing to transmit the data of the sensor signal to another electronic device. The processing circuit 113 also may perform data mining (e.g., noise removal, etc.) to extract significant information from the sensor signal.

Figure 12A:
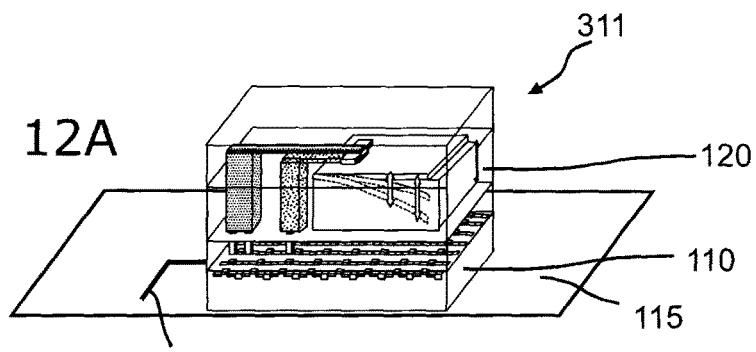
FIG. 12A to FIG. 12C are schematic views showing another strain and pressure sensing device and another electronic device according to the first embodiment.
Figure 12B:
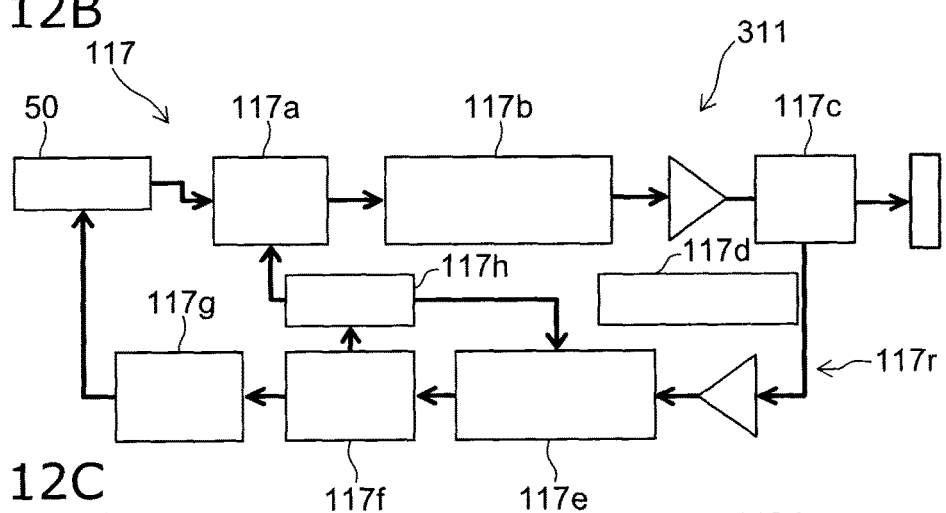
Figure 12C:
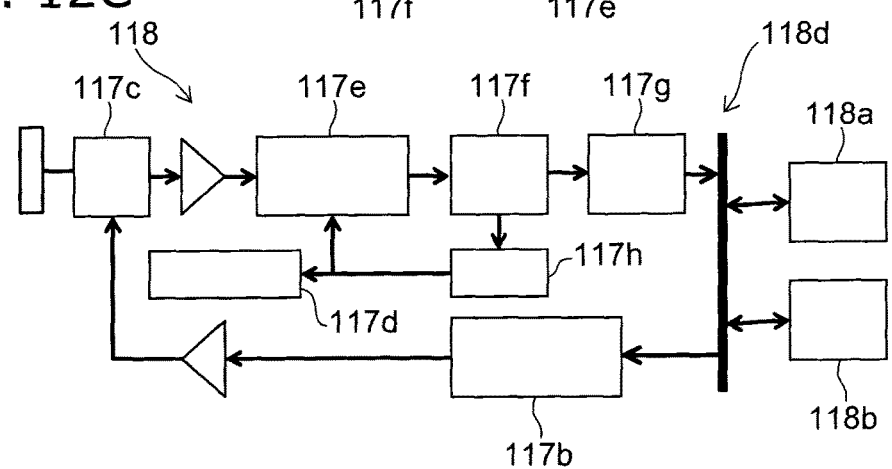

FIG. 12A to FIG. 12C are schematic views illustrating the configurations of another strain and pressure sensing device and another electronic device according to the first embodiment.

FIG. 12A is a schematic perspective view illustrating the configuration of the strain and pressure sensing device 311 according to the embodiment. FIG. 12B illustrates an example of a transmitting circuit 117 provided in the strain and pressure sensing device 311. FIG. 12C illustrates an example of an electronic device 118d used in combination with the strain and pressure sensing device 311.

As shown in FIG. 12A, in addition to the semiconductor circuit unit 110 and the sensing unit 120, the strain and pressure sensing device 311 further includes an antenna 115 and an electrical interconnect 116. The antenna 115 is connected to the semiconductor circuit unit 110 via the electrical interconnect 116.

As shown in FIG. 12B, the transmitting circuit 117 is provided in the strain and pressure sensing device 311. The transmitting circuit 117 performs a wireless transmission of the data based on the electrical signal flowing in the strain sensing element unit 50. At least a portion of the transmitting circuit 117 may be provided in the semiconductor circuit unit 110. The semiconductor circuit unit 110 may include the transmitting circuit 117 to perform the wireless transmission of the data based on the electrical signal flowing in the strain sensing element unit 50.

As shown in FIG. 12C, a receiving unit 118 is provided in the electronic device 118d which is used in combination with the strain and pressure sensing device 311. For example, an electronic device such as a portable terminal, etc., is used as the electronic device 118d.

For example, better convenience is provided by the strain and pressure sensing device 311 which includes the transmitting circuit 117 being combined with the electronic device 118d which includes the receiving unit 118.

In this example as shown in FIG. 12B, a receiving circuit 117r that receives the control signal from the electronic device 118d is provided in the strain and pressure sensing device 311. For example, at least a portion of the receiving circuit 117r may be provided in the semiconductor circuit unit 110. By providing the receiving circuit 117r, for example, the operation of the strain and pressure sensing device 311 can be controlled by operating the electronic device 118d.

In this example as shown in FIG. 12B, for example, an AD converter 117a and a Manchester encoding unit 117b that are connected to the strain sensing element unit 50 are provided as the transmitting circuit 117 in the strain and pressure sensing device 311. A switching unit 117c is further provided to switch between transmitting and receiving. This switching is controlled by a timing controller 117d. A data correcting unit 117e, a synchronizing unit 117f, and a determining unit 117g are provided as the receiving circuit 117r. A voltage-controlled oscillator 117h (VCO) is further provided.

On the other hand, as shown in FIG. 12C, the Manchester encoding unit 117b, the switching unit 117c, the timing controller 117d, the data correcting unit 117e, the synchronizing unit 117f, the determining unit 117g, and the voltage-controlled oscillator 117h are provided in the electronic device 118d; and a storage unit 118a and a central processing unit 118b (a CPU) also are provided in the electronic device 118d.

An example of a method for manufacturing a strain and pressure sensing device including the quadrilateral diaphragm unit 61b as in the sensing unit 121 illustrated in FIG. 6A to FIG. 6C will now be described as an example of a method for manufacturing the strain and pressure sensing device 310 according to the embodiment.

FIG. 13A, FIG. 13B, FIG. 14A, FIG. 14B, FIG. 15A, FIG. 15B, FIG. 16A, FIG. 16B, FIG. 17A, FIG. 17B, FIG. 18A, FIG. 18B, FIG. 19A, FIG. 19B, FIG. 20A, FIG. 20B, FIG. 21A, FIG. 21B, FIG. 22A, FIG. 22B, FIG. 23A, FIG. 23B, FIG. 24A, and FIG. 24B are schematic views illustrating the method for manufacturing the strain and pressure sensing device according to the first embodiment.

FIG. 13A to FIG. 24A are schematic plan views; and FIG. 13B to FIG. 24B are schematic cross-sectional views.

Figure 13A:
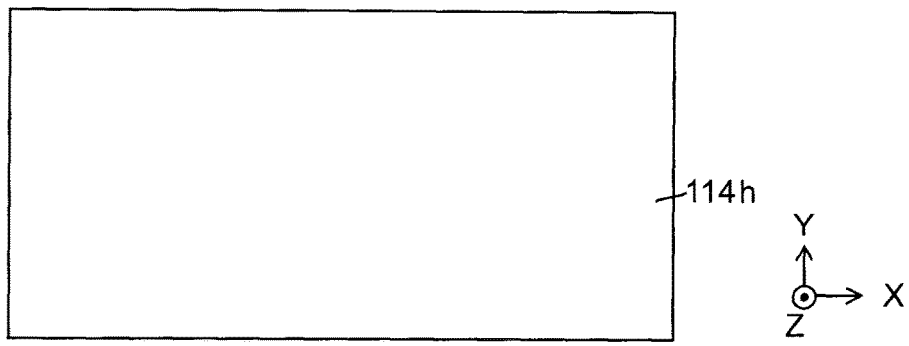
Figure 13B:
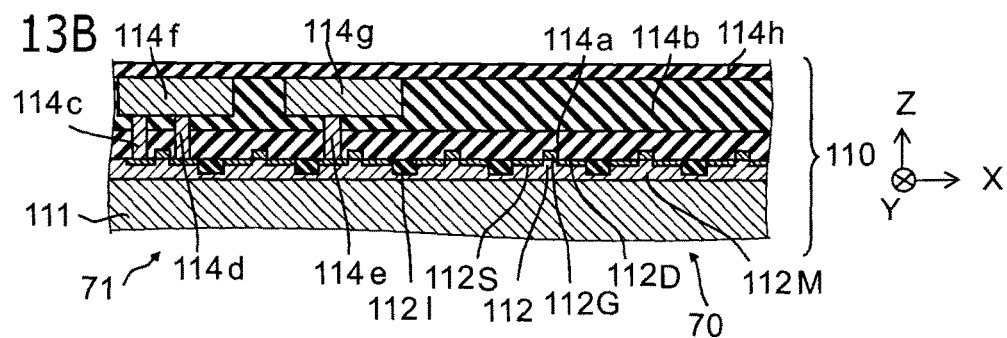

As shown in FIG. 13A and FIG. 13B, a semiconductor layer 112M is provided in the front surface portion of the semiconductor substrate 111. An element-separating insulation layer 112I is formed in the upper surface of the semiconductor layer 112M. A gate 112G is formed on the semiconductor layer 112M with a not-illustrated insulating layer interposed. The transistor 112 is formed by forming a source 112S and a drain 112D on two sides of the gate 112G. Then, an inter-layer insulating film 114b is formed by forming an inter-layer insulating film 114a on the transistor 112.

Trenches and holes are made in a portion of the inter-layer insulating films 114a and 114b in the region used to form the non-space portion 71. Connecting pillars 114c to 114e are formed by filling a conductive material into the holes. In this example, the connecting pillar 114c is connected to the source 112S of one transistor; and the connecting pillar 114d is connected to the drain 112D. The connecting pillar 114e is connected to the source 112S of another transistor. An interconnect unit 114f and an interconnect unit 114g are formed by filling a conductive material into the trenches. The interconnect unit 114f is connected to the connecting pillar 114c and the connecting pillar 114d. The interconnect unit 114g is connected to the connecting pillar 114e. An inter-layer insulating film 114h is formed on the inter-layer insulating film 114b.

Figure 14A:
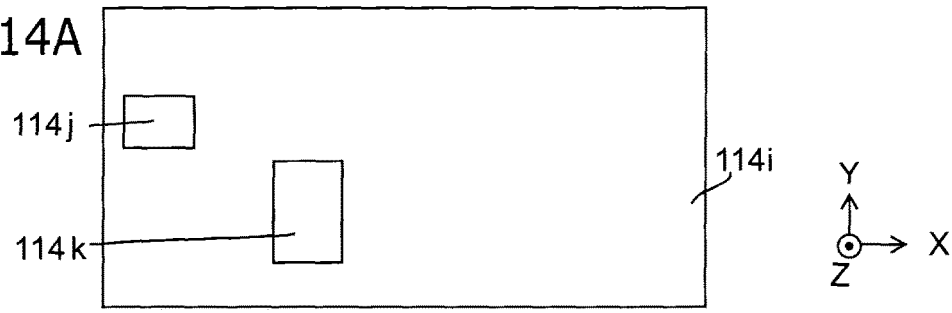
Figure 14B:
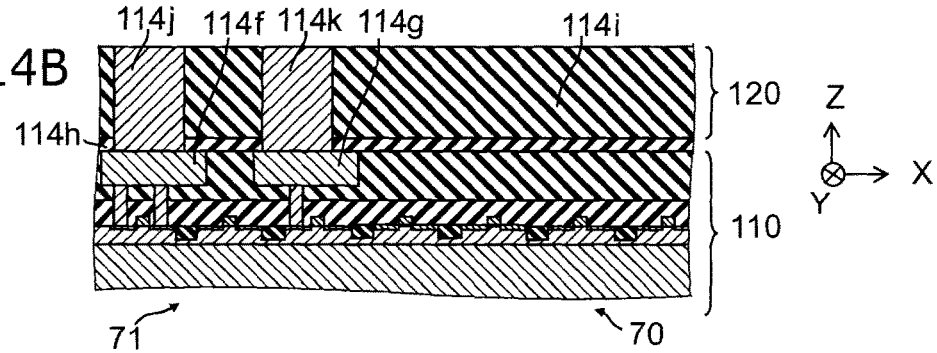

As shown in FIG. 14A and FIG. 14B, $SiO_2$ that is used to form an inter-layer insulating film 114i is formed on the inter-layer insulating film 114h by, for example, CVD. Holes are made in the inter-layer insulating film 114i at prescribed positions; a conductive material (a metal material) is filled into the holes; and the upper surface is planarized by CMP. Thereby, a connecting pillar 114j is formed to be connected to the interconnect unit 114f; and a connecting pillar 114k is formed to be connected to the interconnect unit 114g.

As shown in FIG. 15A and FIG. 15B, a trench is made in the region of the inter-layer insulating film 114i used to form the space portion 70; and a sacrificial layer 114l is filled into this trench. The sacrificial layer 114l may include, for example, SiGe and the like. The sacrificial layer 114l includes a material that can be formed at a low temperature.

As shown in FIG. 16A and FIG. 16B, an insulating film 61bf ($SiO_2$ and the like) that is used to form the diaphragm unit 61b is formed on the inter-layer insulating film 114i and the sacrificial layer 114l. A connecting pillar 61fa and a connecting pillar 62fa are formed by providing holes in the insulating film 61bf and filling a conductive material (a metal) into the holes. The connecting pillar 61fa is connected to the connecting pillar 114k; and the connecting pillar 62fa is connected to the connecting pillar 114j.

As shown in FIG. 17A and FIG. 17B, a conductive layer 61f used to form the first interconnect layer 61 is formed on the insulating film 61bf, the connecting pillar 61fa, and the connecting pillar 62fa.

As shown in FIG. 18A and FIG. 18B, a stacked film 50f used to form the strain sensing element unit 50 is formed on the conductive layer 61f.

Figure 19A:
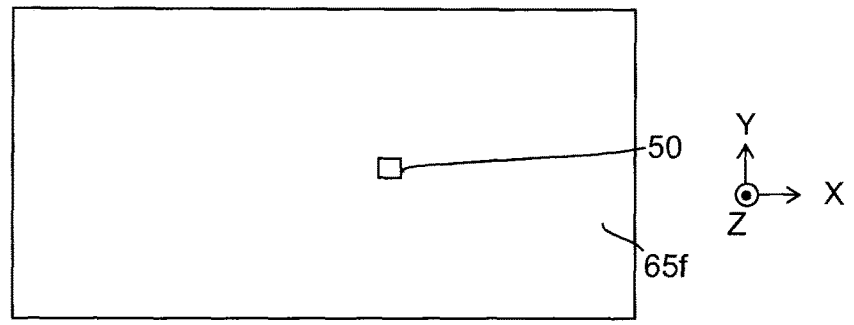
Figure 19B:
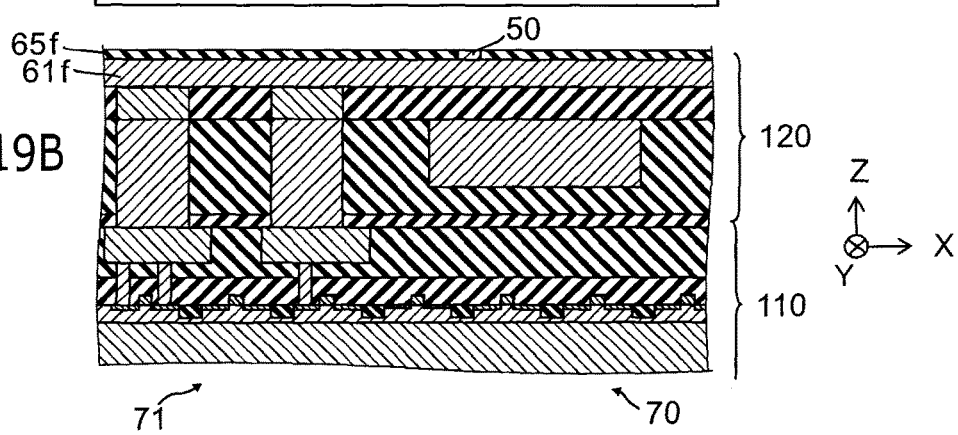

As shown in FIG. 19A and FIG. 19B, the stacked film 50f is patterned into a prescribed configuration; and an insulating film 65f ($SiO_2$ and the like) that is used to form the insulating layer 65 is formed thereon.

Figure 20A:
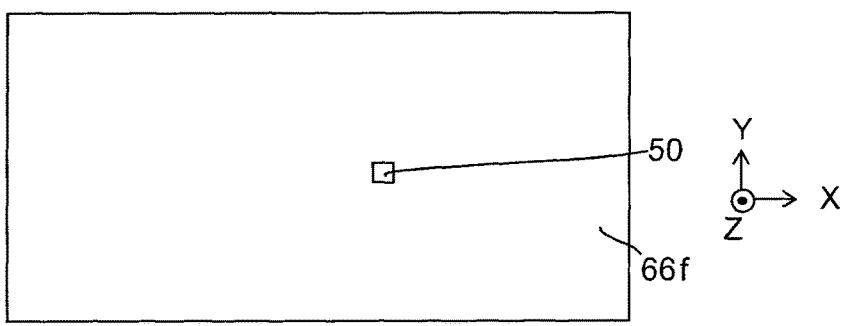
Figure 20B:
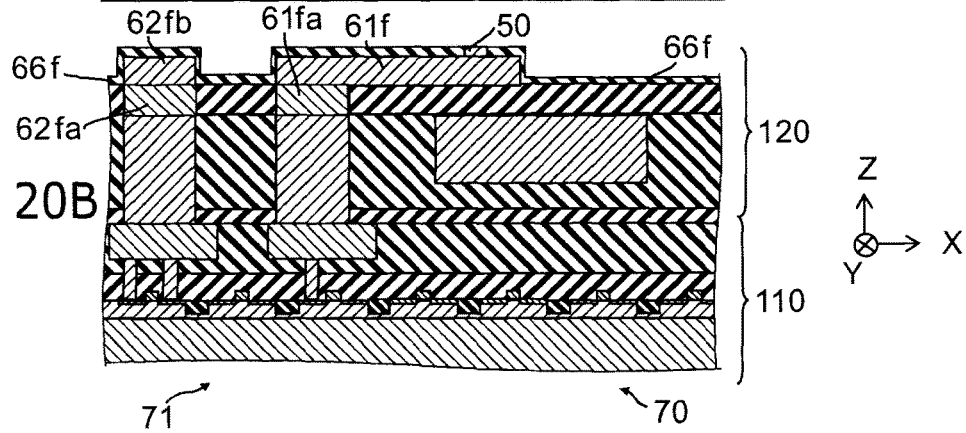

As shown in FIG. 20A and FIG. 20B, a portion of the insulating film 65f is removed; and the conductive layer 61f is patterned into a prescribed configuration. Thereby, the configuration of the first interconnect layer 61 is formed. At this time, a portion of the conductive layer 61f becomes a connecting pillar 62fb that is connected to the connecting pillar 62fa. Then, an insulating film 66f used to form the insulating layer 66 is formed thereon.

As shown in FIG. 21A and FIG. 21B, an opening 66p is made in the insulating film 66f. Thereby, the connecting pillar 62fb is exposed.

As shown in FIG. 22A and FIG. 22B, a conductive layer 62f used to form the second interconnect layer 62 is formed thereon. A portion of the conductive layer 62f is connected to the connecting pillar 62fb.

Figure 23A:
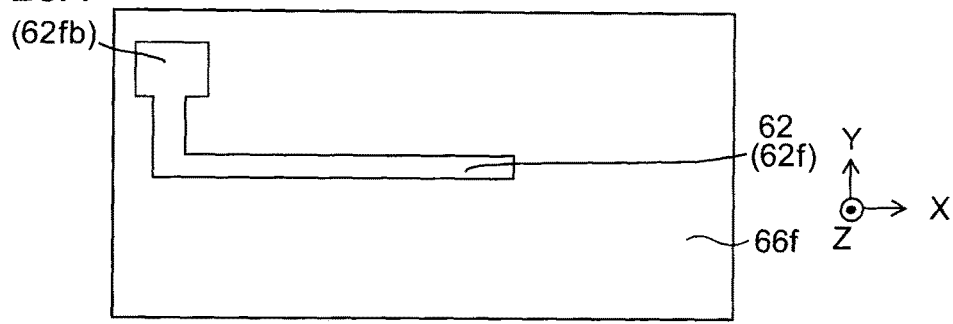
Figure 23B:
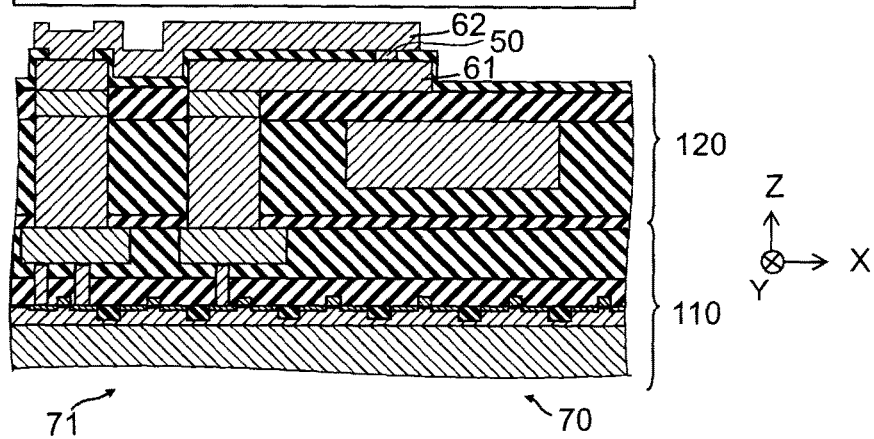

As shown in FIG. 23A and FIG. 23B, the conductive layer 62f is patterned into a prescribed configuration. Thereby, the second interconnect layer 62 is formed. The second interconnect layer 62 is connected to the connecting pillar 62fb.

Figure 24A:
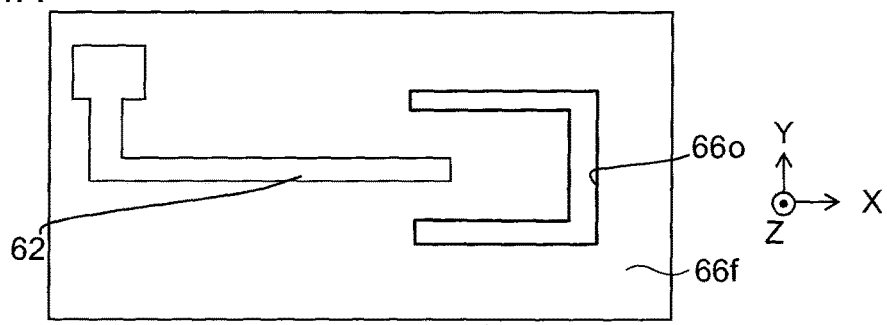
Figure 24B:
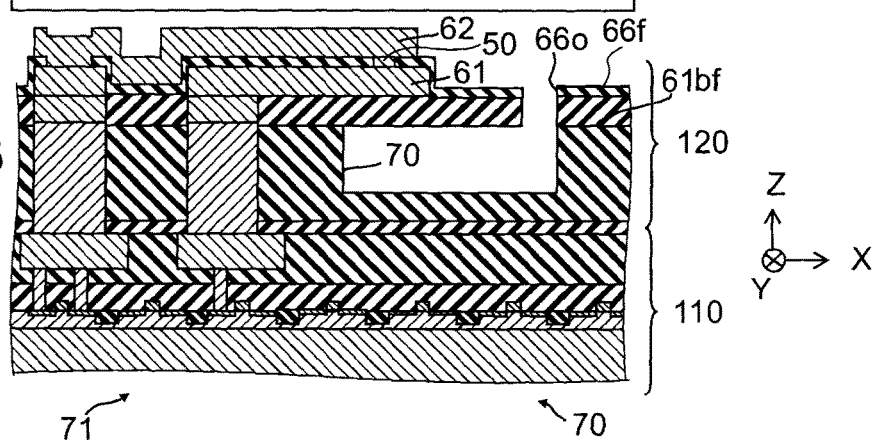

As shown in FIG. 24A and FIG. 24B, an opening 660 is made in the insulating film 66f in a prescribed configuration. The insulating film 61bf is patterned; and the sacrificial layer 114l is removed via the opening 660. Thereby, the space portion 70 is formed. In the removal of the sacrificial layer 114l, for example, the sacrificial layer 114l is removed (e.g., etched) from the upper surface of the sacrificial layer 114l (the surface on the side of the sacrificial layer 114l opposite to the semiconductor substrate 111).

Thereby, the strain and pressure sensing device 310 according to the embodiment can be formed.

Figure 25A:
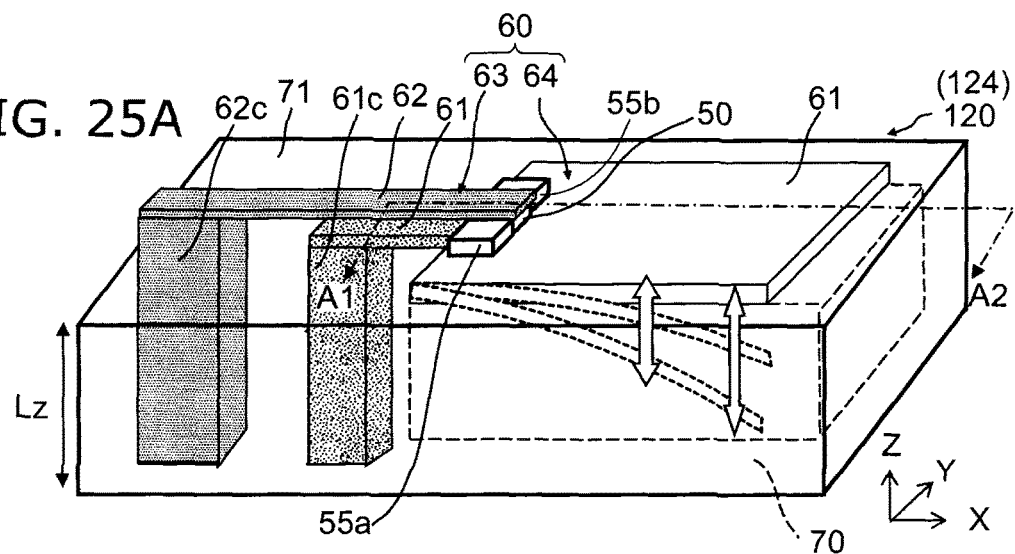
FIG. 25A to FIG. 25C are schematic views showing a portion of the strain and pressure sensing device according to the first embodiment.
Figure 25B:
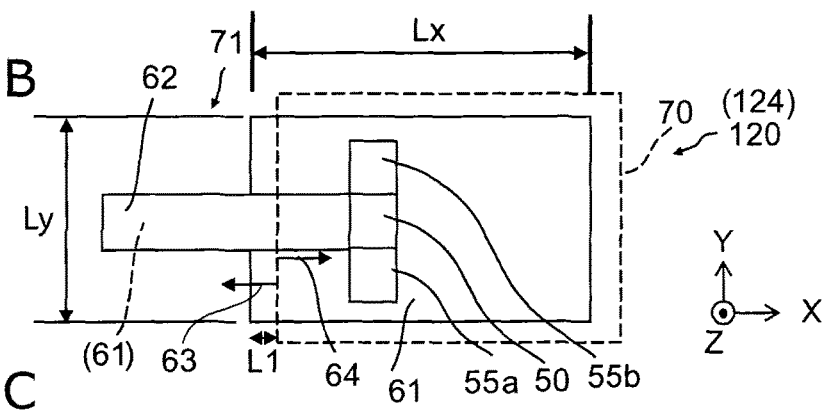
Figure 25C:
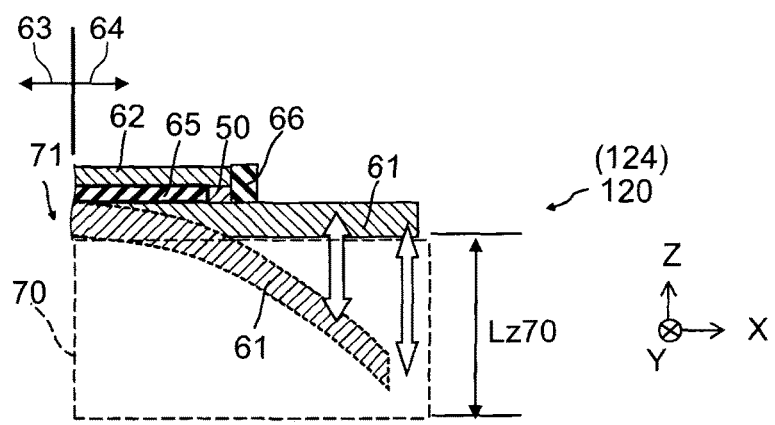

FIG. 25A to FIG. 25C are schematic views illustrating the configuration of a portion of the strain and pressure sensing device according to the first embodiment.

These drawings illustrate the configuration of a sensing unit 124 which is one example of the sensing unit 120. FIG. 25A is a perspective view. FIG. 25B is a plan view. FIG. 25C is a cross-sectional view along line A1-A2 of FIG. 25A.

In this example as shown in FIG. 25A, the diaphragm unit 61b is not provided; and the first interconnect layer 61 functions as the diaphragm unit 61b.

The first interconnect layer 61 is provided further on the lower side than is the second interconnect layer 62. In other words, the first interconnect layer 61 is provided between the second interconnect layer 62 and the semiconductor circuit unit 110 (which is not illustrated in FIG. 25A).

The width of the first interconnect layer 61 in the movable portion 64 along the Y-axis direction (the direction parallel to the major surface 111a and perpendicular to the X-axis direction from the fixed portion 63 toward the movable portion 64) is wider than the width of the second interconnect layer 62 in the movable portion 64 along the Y-axis direction.

In the case where the diaphragm unit 61b is not provided, the length Ly of the movable portion 64 in the Y-axis direction corresponds to the length of the first interconnect layer 61 in the movable portion 64 in the Y-axis direction. The length Lx of the movable portion 64 in the X-axis direction corresponds to the length of the first interconnect layer 61 in the movable portion 64 in the X-axis direction.

By the first interconnect layer 61 functioning as the diaphragm unit 61b, the configuration is simple and the manufacturing processes are simple. In such a sensing unit 124 as well, the strain can be sensed with high sensitivity for a micro region.

An example of a method for manufacturing a strain and pressure sensing device including the sensing unit 124 illustrated in FIG. 25A to FIG. 25C will now be described.

FIG. 26A, FIG. 26B, FIG. 27A, FIG. 27B, FIG. 28A, FIG. 28B, FIG. 29A, FIG. 29B, FIG. 30A, FIG. 30B, FIG. 31A, FIG. 31B, FIG. 32A, FIG. 32B, FIG. 33A, and FIG. 33B are schematic views illustrating the method for manufacturing the strain and pressure sensing device according to the first embodiment.

FIG. 26A to FIG. 33A are schematic plan views; and FIG. 26B to FIG. 33B are schematic cross-sectional views. The processes that are subsequent to processes similar to those described in regard to FIG. 13A to FIG. 15B will now be described.

As shown in FIG. 26A and FIG. 26B, the conductive layer 61f used to form the first interconnect layer 61 is formed on the connecting pillar 114j, the connecting pillar 114k, the inter-layer insulating film 114i, and the sacrificial layer 114l.

As shown in FIG. 27A and FIG. 27B, the stacked film 50f used to form the strain sensing element unit 50 is formed on the conductive layer 61f.

As shown in FIG. 28A and FIG. 28B, the stacked film 50f is patterned into a prescribed configuration; and the insulating film 65f ($SiO_2$ and the like) that is used to form the insulating layer 65 is formed thereon.

As shown in FIG. 29A and FIG. 29B, a portion of the insulating film 65f is removed; and the conductive layer 61f is patterned into a prescribed configuration. Thereby, the configuration of the first interconnect layer 61 is formed. The first interconnect layer 61 is connected to the connecting pillar 114k. At this time, a portion of the conductive layer 61f becomes the connecting pillar 62fb that is connected to the connecting pillar 114j. Then, the insulating film 66f used to form the insulating layer 66 is formed thereon.

As shown in FIG. 30A and FIG. 30B, the opening 66p is made in the insulating film 66f. Thereby, the connecting pillar 62fb is exposed.

As shown in FIG. 31A and FIG. 31B, the conductive layer 62f used to form the second interconnect layer 62 is formed thereon. A portion of the conductive layer 62f is connected to the connecting pillar 62fb.

Figure 32A:
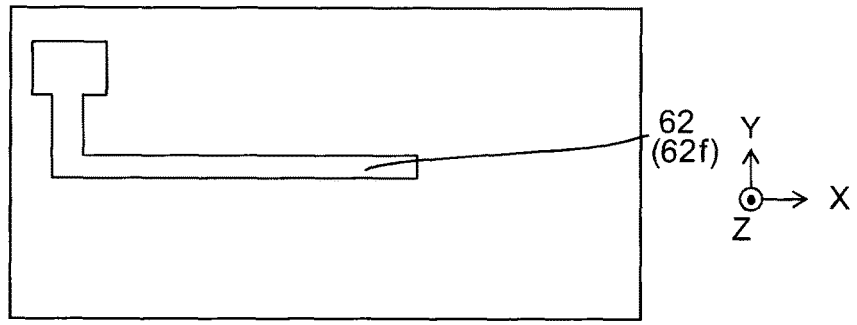
Figure 32B:
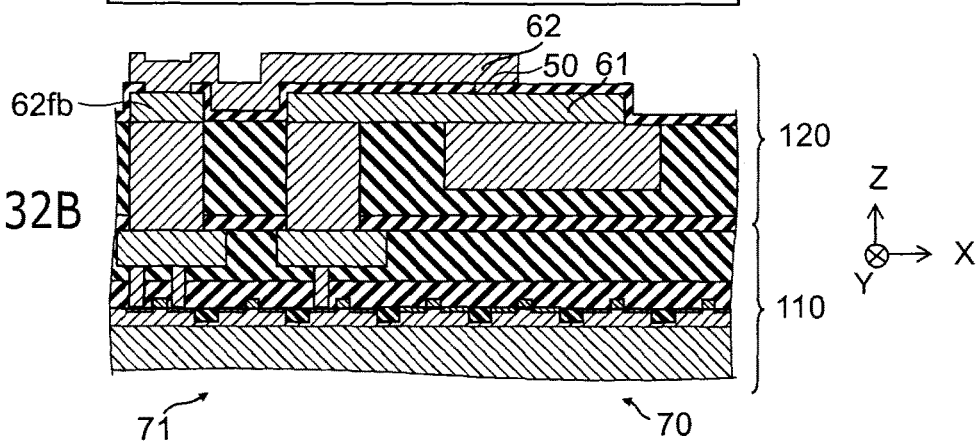

As shown in FIG. 32A and FIG. 32B, the conductive layer 62f is patterned into a prescribed configuration. Thereby, the second interconnect layer 62 is formed. The second interconnect layer 62 is connected to the connecting pillar 62fb.

Figure 33A:
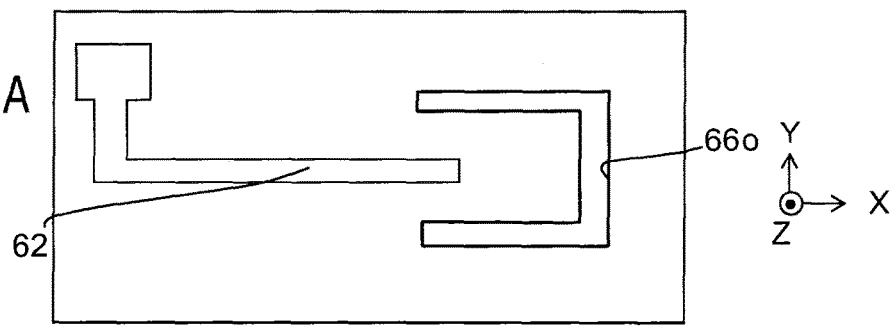
Figure 33B:
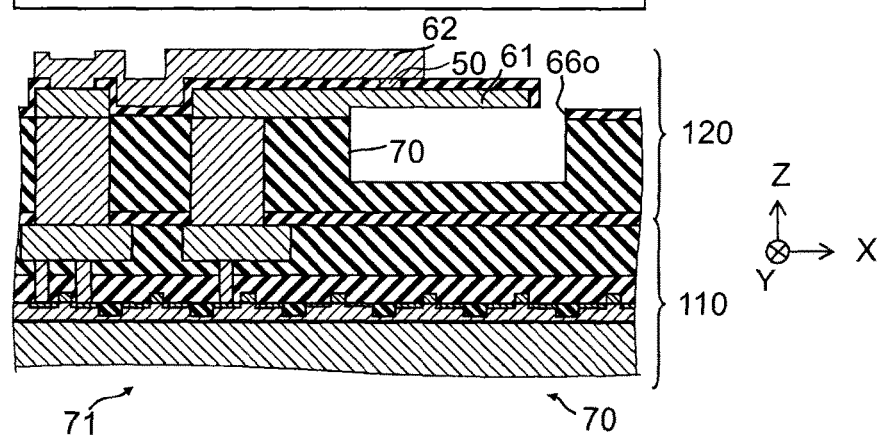

As shown in FIG. 33A and FIG. 33B, an opening 66o is made in the insulating film 66f in a prescribed configuration. The sacrificial layer 114l is removed via the opening 66o. Thereby, the space portion 70 is formed.

Thereby, the strain and pressure sensing device including the sensing unit 124 can be formed. In this configuration, the manufacturing is simple because the first interconnect layer 61 functions as the diaphragm unit 61b and the configuration is simple.

Figure 34:
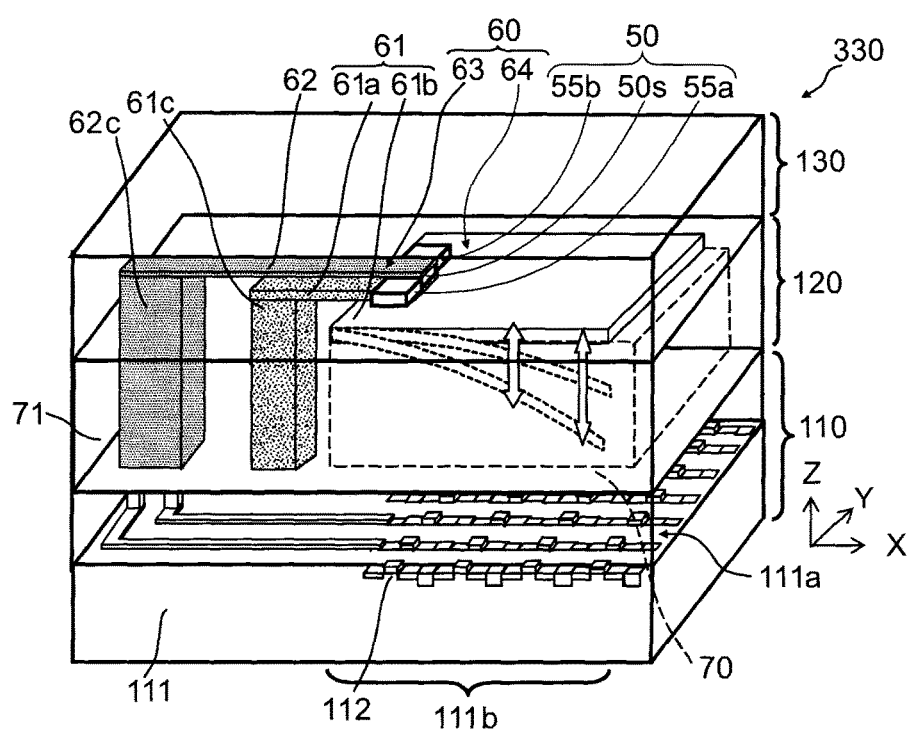
FIG. 34 is a schematic perspective view showing another strain and pressure sensing device according to the first embodiment.

FIG. 34 is a schematic perspective view illustrating the configuration of another strain and pressure sensing device according to the first embodiment.

In the strain and pressure sensing device 330 according to the embodiment as shown in FIG. 34, the first buried interconnect 61c and the second buried interconnect 62c of the sensing unit 120 are electrically connected to the transistor 112 provided below the space portion 70.

In this example, the current flowing in the strain sensing element unit 50 flows in the transistor 112 provided under the space portion 70 via the first interconnect layer 61, the second interconnect layer 62, the first buried interconnect 61c, and the second buried interconnect 62c.

By the configuration in which the transistor 112 provided under the strain sensing element unit 50 senses the resistance change of the strain sensing element unit 50, for example, the chip surface area can be reduced.

Second Embodiment

The embodiment relates to a method for manufacturing the strain and pressure sensing device.

Figure 35:
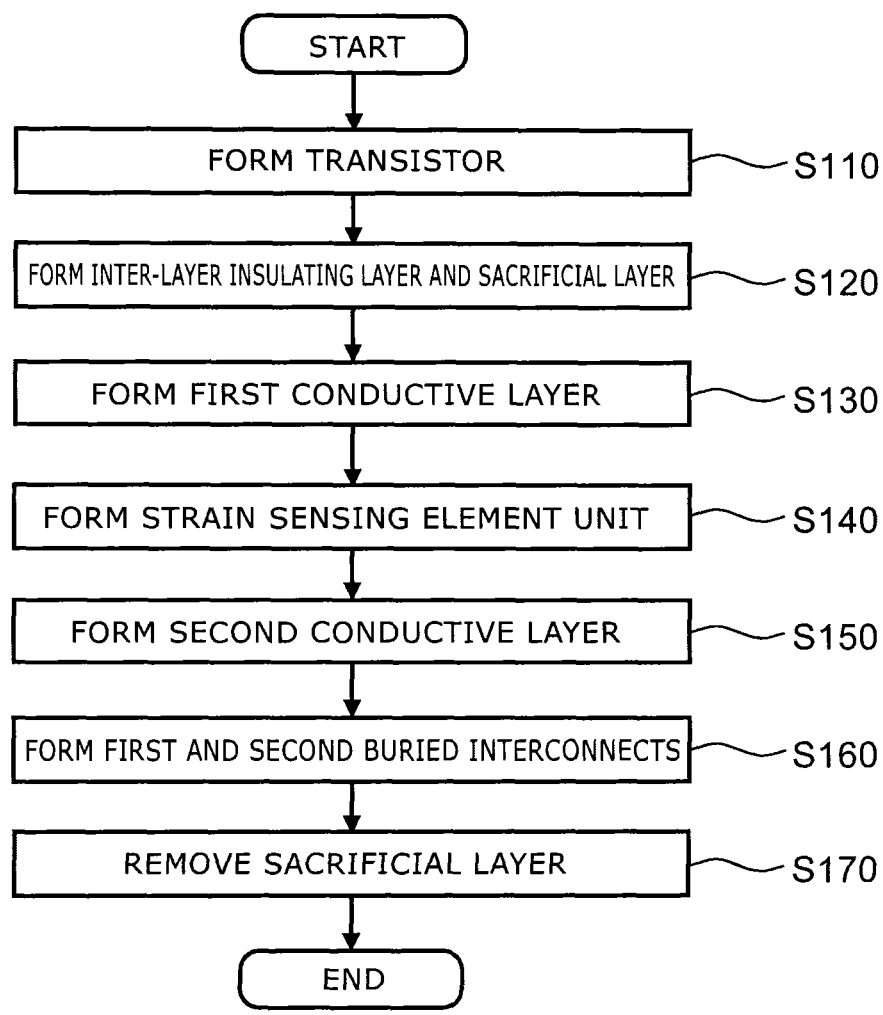
FIG. 35 is a flowchart showing a method for manufacturing the strain and pressure sensing device according to a second embodiment.

FIG. 35 is a flowchart illustrating the method for manufacturing the strain and pressure sensing device according to the second embodiment.

In the method for manufacturing the strain and pressure sensing device according to the embodiment as shown in FIG. 35, the transistor 112 is formed on the semiconductor substrate 111 (step S110). For example, the processing described in regard to FIG. 13A and FIG. 13B is performed.

In this manufacturing method, an inter-layer insulating layer is formed on the semiconductor substrate 111; and the sacrificial layer 114l is formed on the transistor 112 (step S120). For example, the processing described in regard to FIG. 14A to FIG. 15B is performed. This inter-layer insulating layer includes, for example, the inter-layer insulating film 114i.

The first conductive layer (the conductive layer 61f) that is used to form the first interconnect layer 61 is formed on the inter-layer insulating layer (e.g., the inter-layer insulating film 114i) and the sacrificial layer 114l (step S130). For example, the processing described in regard to FIG. 17A and FIG. 17B is performed. The diaphragm unit 61b may be formed prior to step S130.

The strain sensing element unit 50 that includes the first magnetic layer 10 is formed on the first conductive layer (the conductive layer 61f) on the sacrificial layer 114l (step S140). For example, the processing described in regard to FIG. 18A to FIG. 19B is performed.

The second conductive layer (the conductive layer 62f) that is used to form the second interconnect layer 62 is formed on the strain sensing element unit 50 (step S150). For example, the processing described in regard to FIG. 22A to FIG. 23B is performed.

The first buried interconnect 61c is formed inside the inter-layer insulating layer to electrically connect the first conductive layer (the conductive layer 61f) to the semiconductor substrate 111; and the second buried interconnect 62c is formed inside the inter-layer insulating layer to electrically connect the second conductive layer (the conductive layer 62f) to the semiconductor substrate 111 (step S160). For example, the processing described in regard to FIG. 13A, FIG. 13B, FIG. 14A, FIG. 14B, FIG. 16A, FIG. 16B, FIG. 20A, and FIG. 20B is performed. For example, step S160 is implemented once or multiply in at least one process between step S110 to step S150 or after step S150 recited above.

Then, the sacrificial layer 114l is removed (step S170). For example, the processing described in regard to FIG. 24A and FIG. 24B is performed.

Thereby, a method for manufacturing a strain and pressure sensing device can be provided to sense the strain with high sensitivity for a micro region.

The process of removing the sacrificial layer 114l (step S170) recited above includes, for example, removing (e.g., etching) the sacrificial layer 114l from the upper surface of the sacrificial layer 114l (the surface on the side of the sacrificial layer 114l opposite to the semiconductor substrate 111).

The method for manufacturing the strain and pressure sensing device recited above can be applied to a method for manufacturing a microphone.

According to the embodiment, a strain and pressure sensing device, a microphone, a method for manufacturing a strain and pressure sensing device, and a method for manufacturing a microphone are provided to sense the strain with high sensitivity for a micro region.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in strain and pressure sensing devices such as semiconductor circuit units, semiconductor substrates, transistors, strain sensing units, fixed portions, movable portions, strain sensing element units, first magnetic layers, second magnetic layers, intermediate layers, first interconnect layers, second interconnect layers, diaphragm units, first buried interconnects, second buried interconnects, transducer units, and the like from known art; and such practice is included in the scope of the invention to the extent that similar effects are obtained.

Further, any two or more components of the specific examples may be combined within the extent of technical feasibility and are included in the scope of the invention to the extent that the purport of the invention is included.

Moreover, all strain and pressure sensing devices and methods for manufacturing strain and pressure sensing devices practicable by an appropriate design modification by one skilled in the art based on the strain and pressure sensing devices and the methods for manufacturing strain and pressure sensing devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a strain and pressure sensing device, comprising:
    forming a transistor on a semiconductor substrate;
    forming a sacrificial layer on the transistor;
    forming a sensing unit on the sacrificial layer, and
    removing the sacrificial layer,
    the sensing unit including a diaphragm and a strain sensing element, the diaphragm being separated from the transistor, a space being provided between the transistor and the diaphragm, the strain sensing element being fixed to the diaphragm, and the strain sensing element including a first magnetic layer, a second magnetic layer; and a nonmagnetic intermediate layer provided between the first magnetic layer and the second magnetic layer, wherein
    the first magnetic layer includes at least one selected from a group consisting of Co, Fe and Ni, and the second magnetic layer includes at least one selected from a group consisting of Co, Fe and Ni,
    one of the first magnetic layer and the second magnetic layer is positioned between the diaphragm and the other one of the first magnetic layer and the second magnetic layer,
    an electrical resistance of the sensing unit changes in accordance with a deformation of the diaphragm, and
    the first magnetic layer overlaps a part of the diaphragm, and the diaphragm includes a region not overlapping the first magnetic layer.

2. A method for manufacturing a microphone, comprising:
    forming a transistor on a semiconductor substrate;
    forming a sacrificial layer on the transistor;
    forming a sensing unit on the sacrificial layer; and
    removing the sacrificial layer,
    the sensing unit including a diaphragm and a strain sensing element, the diaphragm being separated from the transistor, a space being provided between the transistor and the diaphragm, the strain sensing element being fixed to the diaphragm, and the strain sensing element including a first magnetic layer, a second magnetic layer; and a nonmagnetic intermediate layer provided between the first magnetic layer and the second magnetic layer, wherein the first magnetic layer includes at least one selected from a group consisting of Co, Fe and Ni, and the second magnetic layer includes at least one selected from a group consisting of Co, Fe and Ni, one of the first magnetic layer and the second magnetic layer is positioned between the diaphragm and the other one of the first magnetic layer and the second magnetic layer, an electrical resistance of the sensing unit changes in accordance with a deformation of the diaphragm, and the first magnetic layer overlaps a part of the diaphragm, and the diaphragm includes a region not overlapping the first magnetic layer.

3. The method according to claim 1, wherein the second magnetic layer is a magnetization fixed layer or a magnetization free layer.

4. The method according to claim 1, wherein at least one of the first magnetic layer and the second magnetic layer includes at least one of Fe, Co and Ni.

5. The method according to claim 1, wherein a length of the strain sensing element along a direction perpendicular to an upper surface of the semiconductor substrate is not less than 20 nanometers and not more than 100 nanometers.

6. The method according to claim 1, wherein the strain sensing element further includes a bias layer juxtaposed with the first magnetic layer to apply a bias magnetic field to the first magnetic layer.

7. The method according to claim 1, wherein a magnetostriction constant of the first magnetic layer is not less than $10^{-5}$.

8. The method according to claim 2, wherein the second magnetic layer is a magnetization fixed layer or a magnetization free layer.

9. The method according to claim 2, wherein at least one of the first magnetic layer and the second magnetic layer includes at least one of Fe, Co and Ni.

10. The method according to claim 2, wherein a length of the strain sensing element along a direction perpendicular to an upper surface of the semiconductor substrate is not less than 20 nanometers and not more than 100 nanometers.

11. The method according to claim 2, wherein the strain sensing element further includes a bias layer juxtaposed with the first magnetic layer to apply a bias magnetic field to the first magnetic layer.

12. The method according to claim 2, wherein a magnetostriction constant of the first magnetic layer is not less than $10^{-5}$.

13. The method according to claim 1, wherein a direction connecting the sensing unit and the transistor extends along a direction connecting the first magnetic layer and the second magnetic layer.

14. The method according to claim 2, wherein a direction connecting the sensing unit and the transistor extends along a direction connecting the first magnetic layer and the second magnetic layer.

15. The method according to claim 1, wherein the strain sensing element further includes a first electrode and a second electrode, the first magnetic layer is positioned between the first electrode and the second electrode, and the second magnetic layer is positioned between the first electrode and the first magnetic layer.

16. The method according to claim 2, wherein the strain sensing element further includes a first electrode and a second electrode, the first magnetic layer is positioned between the first electrode and the second electrode, and the second magnetic layer is positioned between the first electrode and the first magnetic layer.

* * * * *